United States Patent [19]

Byrne et al.

[11] Patent Number: 4,986,124
[45] Date of Patent: Jan. 22, 1991

[54] SCREENED INDUCTANCE SENSORS, ESPECIALLY SENSORS FOR LEVEL MEASUREMENT

[75] Inventors: John V. Byrne, Dublin; Francis McMullin, Clare; Aengus Murray, Dublin, all of Northern Ireland

[73] Assignee: Kollmorgen Corporation, Simsbury, Conn.

[21] Appl. No.: 207,384

[22] Filed: Jun. 15, 1988

[30] Foreign Application Priority Data

Jun. 15, 1987 [IE] Ireland .................................. 1575/87
Jun. 15, 1987 [IE] Ireland .................................. 1576/87

[51] Int. Cl.$^5$ ........................ G01F 23/32; G01F 23/38
[52] U.S. Cl. ......................................... 73/317; 73/313;
73/DIG. 5; 73/305; 73/308; 324/208; 324/204;
336/75; 336/79; 318/653; 340/625
[58] Field of Search .................. 73/290 R, 305, 308,
73/313, 317, DIG. 5; 324/204, 207, 208;
336/75, 79, 87; 340/623, 624, 625; 318/653

[56] References Cited

U.S. PATENT DOCUMENTS

| | | | |
|---|---|---|---|
| 2,424,766 | 7/1947 | Miner | 73/313 |
| 3,491,289 | 1/1970 | Petrini | 324/208 |
| 3,948,100 | 4/1976 | Paris et al. | 73/290 R |
| 4,006,637 | 2/1977 | Kinosita | 73/313 |
| 4,042,876 | 8/1977 | Visioli, Jr. | 324/207 |
| 4,123,735 | 10/1978 | Mash et al. | 336/79 |
| 4,210,865 | 7/1980 | Nikolaev et al. | 324/207 |
| 4,447,743 | 5/1984 | Bean et al. | 324/207 |
| 4,567,435 | 1/1986 | Yamada et al. | 324/207 |
| 4,580,096 | 4/1986 | Liedholz | 324/204 |
| 4,627,280 | 12/1986 | Hayashi et al. | 73/290 R |
| 4,717,874 | 1/1988 | Ichikawa et al. | 324/208 |
| 4,723,446 | 2/1988 | Saito et al. | 73/313 |
| 4,737,698 | 4/1988 | McMullin et al. | 336/75 |

FOREIGN PATENT DOCUMENTS

| | | | |
|---|---|---|---|
| 182085 | 5/1986 | European Pat. Off. | 336/75 |
| 58-11864 | 1/1983 | Japan | 324/204 |
| 811417 | 4/1959 | United Kingdom | 73/290 R |

Primary Examiner—William A. Cuchlinski, Jr.
Assistant Examiner—Diego F. F. Gutierrez
Attorney, Agent, or Firm—Morgan & Finnegan

[57] ABSTRACT

In a screened inductance sensor having a drive winding, a sense winding, and a conductive screen for varying the induced voltage in the sense winding by reason of the eddy currents generated in the conductive screen in the presence of the drive field, a physical barrier is interposed between the region of the sensor in the windings are located and the region in which the screen is located. These regions are fully environmentally isolated from each other by the physical barrier. The construction is especially suited to screened inductance level gauges, in particular for fuel tanks, where the conductive screen is part of a float assembly in contact with the fuel, but the electrical windings are kept dry in a separate portion of the gauge. The sensor may make use of printed circuit windings, in particular, concentric turn windings without crossovers providing a similar electrical performance to equivalent distributed turn windings having crossovers, in which the turns are progressively displaced in the direction of relative screen and sense winding displacement.

1 Claim, 25 Drawing Sheets

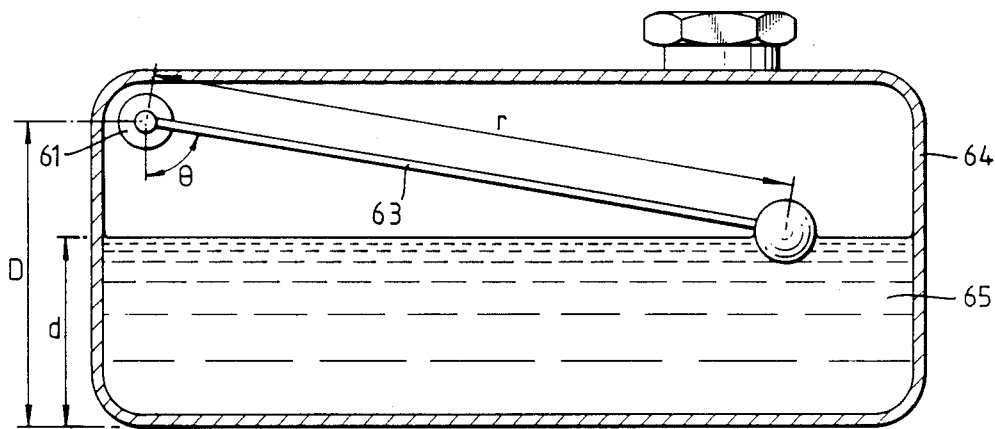
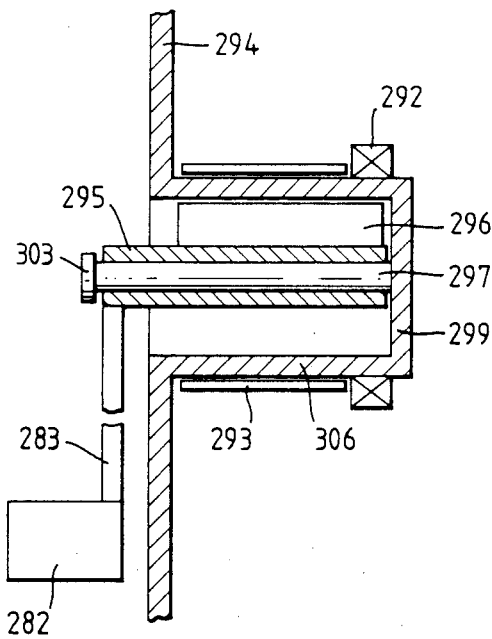
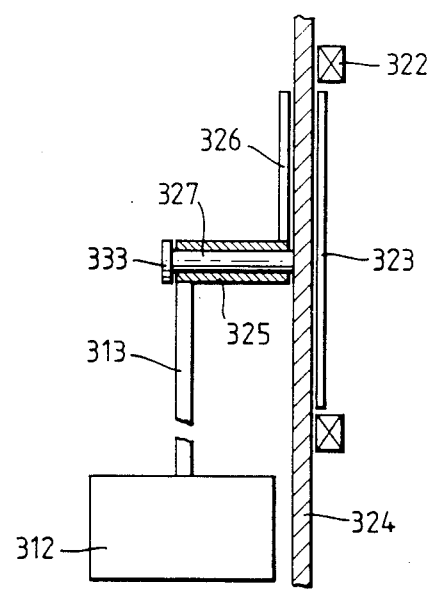

SINGLE TURN WINDING - ELONGATED WORKING STROKE

MULTITURN WINDING - LINEAR PLANAR GEOMETRY

TRANSFORMATION TO ROTARY PLANAR GEOMETRY

Fig. 24.

(a) DATA menu

```
<PCB DATA>     <FILE>INL-ROT1      <Break point calculation>YES
 1 Screen   3 Cycles
1. <TITLE>INL-ROT1 Rotory pot 26/3/87
   Phase A
   Spacing fnc.       1+T*T( .01+ .60*T+ .00*T*T+ .00*T*T*T)/COS( .70*T)
   Error fnc.         NONE Null error function
2. <Outer RAD>  24.00     <Inner RAD>  10.00
3. <Turns> 10     <Spacing>    .60
4. <n1>  8     <n2> 12     <ns>  1     <nj1>  2     <nj2>  2
   Phase B
   Spacing fnc.       1+T*T( .01+ .10*T+ .20*T*T+ .00*T*T*T)/COS( .70*T)
   Error fnc.         NONE
5. <Outer RAD>  24.00     <Inner RAD>  10.00
6. <Turns> 10     <Spacing>    .50
7. <n1>  3     <n2>  2     <ns>  0     <nj1>  2     <nj2>  2

8. <Board OD>  54.00   <Board ID>  16.20
9. <Loc. hole PCD>  52.80   <Loc. hole DIAM>    3.33   <Pad DIAM>    1.10

D  to display <DATA>
<line no.>  to edit <DATA>
R  to RESET Break flag
Q  to quit to <MAIN menu>
EDIT Command>>
```

Fig. 25.

(b) PLOTTING menu

```
<Options Menu>      GRAPHICS
M   Main winding
I   Interconnection Layer
P   Pads
O   Board outline
D   Set all above
S   TOP/BOT winding
R   Reset options
G   Go and Plot
Q   Quit Present Options:  MAIN                        TOP
Option Command>>
```

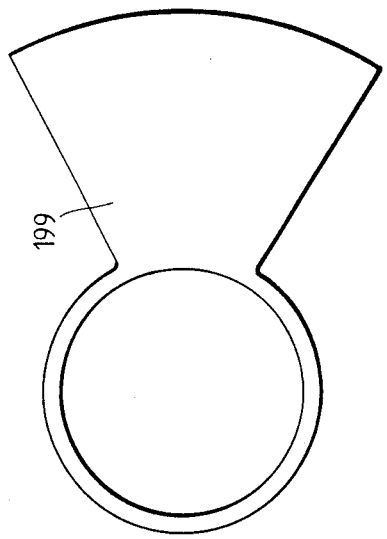
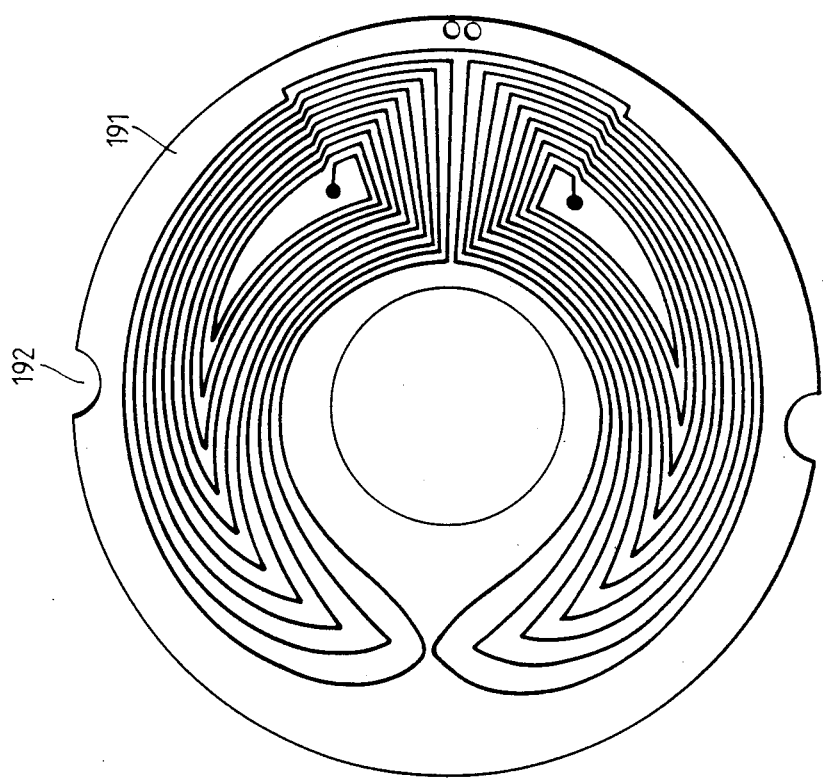
Fig. 26.

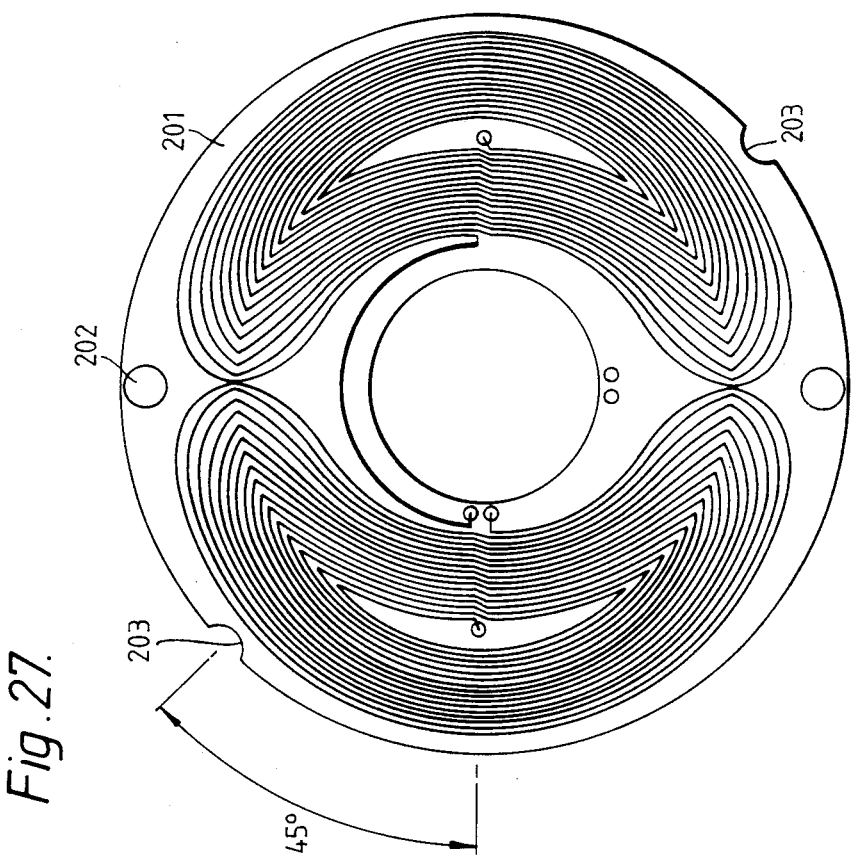
Fig.27.
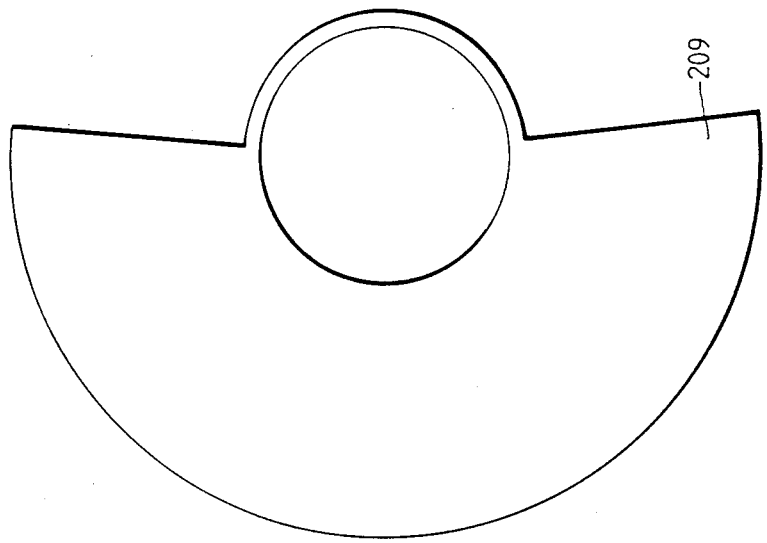

4,986,124

SCREENED INDUCTANCE SENSORS, ESPECIALLY SENSORS FOR LEVEL MEASUREMENT

BACKGROUND OF THE INVENTION

1. Field of the Invention

This invention relates to screened inductance sensors. The invention relates in particular to printed circuit windings for screened inductance sensors including, but not limited to, level gauge sensors having sealing barriers, and to methods for the production of such windings, as well as to screened inductance transducer geometries in which there is a sealing barrier between the windings and the screen(s), especially screened inductance sensors for liquid level measurement.

2. Description of the Prior Art

A screened inductance sensor is a position measurement device in which inductive coupling between two, normally stationary, coils is controlled by the position of a passive conductive screen.

Position and speed measurement systems based on the screened inductance principle have been described in previous patent applications. In particular, position and speed sensors form the subject of co-pending U.S. patent application Ser. No. 789,147, now allowed. According to this application, there is provided a sensor comprising a drive or exciting winding for establishing a forward or drive field, at least one secondary or sense winding in which a voltage may be induced in the presence of said forward or drive field, and at least one conductive screen within which eddy currents are generated in the presence of said forward or drive field to establish a counter-field opposing said forward or drive field, said at least one conductive screen and said at least one secondary or sense winding being displaceable relative to one another within said forward or drive field so that said at least one secondary or sense winding may be shaded by said at least one conductive screen to a varying extent to thereby vary the voltage induced in said at least one secondary or sense winding, the relative displacement of said at least one conductive screen and said at least one secondary or sense winding being limited to substantially a single direction of displacement, said drive or exciting winding being configured so that in the absence of said at least one conductive screen said forward or drive field is substantially even over said at least one secondary or sense winding in said single direction of relative displacement of said at least one conductive screen and said at least one secondary or sense winding, said at least one secondary or sense winding being a two-terminal winding, and said at least one conductive screen having a surface region which is substantially parallel to a notional surface defined by said at least one secondary or sense winding.

Said surface region of said at least one conductive screen may be substantially planar and said at least one secondary or sense winding may be a substantially flat winding defining a plane substantially parallel to said surface region. Said at least one screen and said at least one secondary or sense winding may then suitably be relatively linearly displaceable, or alternatively, they may be relatively rotationally displaceable.

Said surface region of said at least one conductive screen may be a sector of a cylindrical surface and said at least one secondary or sense winding may be disposed about the periphery of a notional cylinder substantially concentric with said cylindrical sector surface region, said at least one conductive screen and said at least one secondary or sense winding then being relatively displaceable in a circumferential direction about the substantially common axis of said cylindrical surface and said notional cylinder.

In an advantageous construction of sensor according to said co-pending Application there is a further secondary or sense winding, the progressive shading of which during said relative displacement of said at least one conductive screen and said at least one secondary or sense winding proceeds in a manner substantially identical with the progressive shading of said at least one secondary or sense winding during said relative displacement, said further secondary or sense winding being disposed relative to said at least one secondary or sense winding so that the progressive shading of said further secondary or sense winding during said relative displacement is spaced apart from that of said at least one secondary or sense winding, the voltage variations in each said secondary or sense winding during said progressive shading preferably following a cyclic pattern and said further secondary or sense winding being disposed relative to said at least one secondary or sense winding so that said voltage variations are in phase quadrature.

In a favoured winding arrangement, said at least one secondary or sense winding has first and second coils, said coils being connected so that in the presence of said forward or drive field the voltage induced in the second coil in the absence of said at least one conductive screen is substantially equal in magnitude but opposite in polarity to the voltage induced in the first coil, said at least one secondary or sense winding preferably having a plurality of coils extending in said single direction of relative displacement and each successive coil in said single direction of relative displacement being wound in the opposite electrical sense to each adjacent coil.

In an especially favoured arrangement, said at least one secondary or sense winding has at least one coil having a pitch or extent in said single direction of relative displacement and said at least one conductive screen has a pitch or extent in said single direction of relative displacement which is substantially equal to the pitch or extent of said at least one coil, said at least one conductive screen having a dimension in a direction at right angles to said single direction of relative displacement which is substantially constant over said pitch or extent of said at least one conductive screen and said at least one secondary or sense winding having a dimension in a direction at right angles to said single direction of relative displacement which is substantially constant over said pitch or extent of said at least one coil, said screen dimension in said direction at right angles to said single direction of relative displacement being optionally substantially equal to the maximum dimension of said at least one secondary or sense winding in said direction at right angles to said direction of relative displacement.

Said at least one secondary or sense winding may have at least one coil having a pitch or extent in said single direction of relative displacement and said at least one conductive screen may have a pitch or extent in said single direction of relative displacement which is substantially different from the pitch or extent of said at least one coil, said at least one secondary or sense winding having a dimension in a direction at right angles to said single direction of relative displacement which changes progressively over said pitch or extent of said at least one coil.

Finally, there is also provided according to said co-pending Application, a sensing system comprising a sensor having a drive or exciting winding for establishing a forward or drive field, at least one secondary or sense winding in which a voltage may be induced in the presence of said forward or drive field, and at least one conductive screen within which eddy currents are generated in the presence of said forward or drive field to establish a counter-field opposing said forward or drive field, said at least one conductive screen and said at least one secondary or sense winding being displaceable relative to one another within said forward or drive field so that said at least one secondary or sense winding may be shaded by said at least one conductive screen to a varying extent to thereby vary the voltage induced in said at least one secondary or sense winding, said relative displacement of said at least one conductive screen and said at least one secondary or sense winding being limited to substantially a single direction of displacement, said drive or exciting winding being configured so that in the absence of said at least one conductive screen said forward or drive field is substantially even over said at least one secondary or sense winding in said single direction of relative displacement of said at least one conductive screen and said at least one secondary or sense winding, said at least one secondary or sense winding being a two-terminal winding, and said at least one conductive screen having a surface region which is substantially parallel to a notional surface defined by said at least one secondary or sense winding, means for applying an alternating voltage to said drive or exciting winding, and means for processing the output signal from said at least one secondary or sense winding to provide a signal indicative of the relative disposition of said at least one conductive screen and said at least one secondary or sense winding.

Said co-pending application also discloses a sensor comprising a substantially solenoidal drive or exciting winding for establishing a forward or drive field, at least one secondary or sense winding in which a voltage may be induced in the presence of said forward or drive field, and at least one conductive screen within which eddy currents are generated in the presence of said forward or drive field to establish a counter-field opposing said forward field, said solenoidal drive or exciting winding and said at least one secondary or sense winding being substantially coaxial, said at least one conductive screen and said at least one secondary or sense winding being displaceable relative to one another within said forward or drive field so that said at least one secondary or sense winding may be shaded by said at least one conductive screen to a varying extent to thereby vary the voltage induced in said at least one secondary or sense winding, said at least one conductive screen having an axis of symmetry and a surface region which extends substantially circumferentially with respect to said axis of symmetry, said at least one secondary or sense winding being disposed about the periphery of a notional cylinder which is substantially coaxial with said axis of symmetry of said at least one conductive screen, and the relative displacement of said at least one conductive screen and said at least one secondary or sense winding being in the direction of said axis of symmetry of said at least one conductive screen and said axis of said notional cylinder which is substantially coaxial therewith.

Said at least one secondary or sense winding may have first and second coils, said coils being connected so that in the presence of said forward or drive field the voltage induced in the second coil in the absence of said at least one conductive screen is substantially equal in magnitude but opposite in polarity to the voltage induced in the first coil.

Said surface region of said at least one conductive screen may be substantially circular cylindrical and said at least one secondary or sense winding may be substantially solenoidal and have a turns density which is substantially uniform along the axial extent of said at least one secondary or sense winding.

In another aspect, said co-pending application also provides a sensing system comprising a sensor having a drive or exciting winding for establishing a forward or drive field, at least one secondary or sense winding in which a voltage may be induced in the presence of said forward or drive field, and at least one conductive screen within which eddy currents are generated in the presence of said forward or drive field to establish a counter-field opposing said forward or drive field, said at least one conductive screen and said at least one secondary or sense winding being displaceable relative to one another within said forward or drive field so that said at least one secondary or sense winding may be shaded by said at least one conductive screen to a varying extent to thereby vary the voltage induced in said at least one secondary or sense winding, said at least one conductive screen having an axis of symmetry and a surface region which extends substantially circumferentially with respect to said axis of symmetry, said at least one secondary or sense winding being disposed about the periphery of a notional cylinder which is substantially coaxial with said axis of symmetry of said at least one conductive screen, and the relative displacement of said at least one conductive screen and said at least one secondary or sense winding being in the direction of the axis of symmetry of said at least one conductive screen and said axis of said notional cylinder which is substantially coaxial therewith, means for applying an alternating voltage to said drive or exciting winding, and means for processing the output signal from said at least one secondary or sense winding to provide a signal indicative of the relative disposition of said at least one conductive screen and said at least one secondary or sense winding.

The basic elements of a screened inductance transducer are, therefore, at least two, normally stationary, coils and a passive, conductive screen, whose position controls the mutual coupling between the coils. The basic screened inductance effect has, surprisingly, found no widespread use in current commercial position measurement systems. It has obvious advantages of simplicity, in particular because of the passive nature of the moving element.

Advantages of screened inductance sensors include:
(a) totally brushless operation,
(b) ease of design for different applications,
(c) simplicity of the materials used in sensor construction, and
(d) ease with which high volume manufacturing techniques, such as injection moulding, can be used in sensor construction.

The latter two points in particular make the screened inductance sensor attractive for use in cost conscious areas such as the automotive industry, for example, as a fuel gauge.

A variety of screened inductance sensors especially suited to liquid level measurement and having screen/winding sealing barriers been described in a further co-pending patent application with particular reference to the use of stainless steel as the barrier material. According to said further co-pending application, there is provided a screened inductance sensor in which barrier means are interposed between the windings and the screen, so that the screen may be disposed within a region environmentally isolatable from the region in which the windings are located.

Said barrier means may be defined by a wall portion and may be formed from stainless steel. The frequency of an energising input to be applied to the drive winding is selected in dependence of the thickness of the wall for the drive field to penetrate said barrier means or wall for the shading of the secondary winding by the screen. The screen may also be at least in part of a relatively poorly conductive material, such as stainless steel.

In a further aspect, said further co-pending application discloses a screened inductance sensor in which the screen is at least in part of a relatively poorly conductive material, such as stainless steel. The barrier means and the screen may be of the same material, such as stainless steel, to contend with the environment in which the device is employed, in which case the screen has a thickness dimension substantially in excess of the thickness of the barrier means.

The use of relatively poorly conductive materials for both the screen and the barrier entails the establishment of an appropriate relativity between their respective thicknesses. That of the barrier means is generally determined by structural demands on the sensor, and the frequency of the energising input to the drive winding is then selected to provide a skin depth sufficient for the passage of the drive field. By contrast, the thickness of the screening element is selected precisely to block the field and thus secure the required screening function. The skin depth determines the extent to which a magnetic field penetrates a material. As conductivity rises, so does field penetration decrease. The appropriate balance of material thicknesses may be selected by calculation from the various parameters of the sensor system and the characteristics of the materials used.

In an especially favoured construction, there is provided according to said further co-pending application a screened inductance level transducer in which the screen has a substantially cylindrical outer peripheral region and the secondary or sense winding is disposed about the periphery of a notional cylinder substantially concentric with said peripheral region of the screen, and said screen and said secondary or sense winding are displaceable with respect to one another in an axial direction relative to the substantially common axis of said screen peripheral region and said notional cylinder, said barrier means being defined by a tube within which said drive screen is axially displaceable, and the drive and sense windings being disposed externally of said tube. Preferably the screen is at least in part of stainless steel and it may consist wholly of stainless steel. Alternatively the screen may be formed from copper or copper encased or sheathed in stainless steel. In a favoured construction, said drive winding is also disposed about the periphery of a further notional cylinder, again substantially concentric with the common axis of said peripheral region of the screen and said first-mentioned notional cylinder.

BRIEF SUMMARY OF THE INVENTION

For many applications where the environment in which the measurements are to be conducted does not entail high temperatures or pressures, a non-metallic material, such as a thermoplastic, may be used for the barrier between the screen and the windings in screened inductance sensors of the kind set forth in said further co-pending application. A fuel tank in a motor vehicle is an example of such a situation.

It is an object of the invention, therefore, to provide advantageous configurations of screened inductance sensors in which a barrier is interposed between the windings and the screen. It is a particular objective of the invention to provide a sensor of the foregoing kind which is especially suited to establishing the level of a liquid within a tank or a container, such as, for example, a level gauge for a vehicle fuel tank. It is a further object of the invention to provide an advantageous method of configuring and manufacturing a printed circuit winding for a screened inductance sensor, including, but not limited to, screened inductance sensors for liquid level measurement. It is a still further object of the invention to provide a design and production method for printed circuit windings for screened inductance sensors especially suited to computer techniques, as well as a computerized design procedure for establishing printed circuit configurations for screened inductance sensors of a variety of geometries.

Thus, in the present application, certain further developments are presented, illustrative of the ease and sophistication of design methods for an important class of screened inductance devices which employ printed circuit windings, together with an example of an application in the automotive area.

According to a first aspect therefore of the invention, there is provided a method of producing a printed circuit winding for a screened inductance sensor comprising the steps of:

(a) evaluating a winding shape for a two pole planar linear geometry for specified requirements of the winding.

(b) transforming said two pole planar linear geometry of winding shape to a winding shape appropriate to specified requirements of the sensor, and (c) outputting said transformed winding shape to provide printed circuit artwork.

Said specified requirements of the sensor may represent an alternative geometry, such as, for example, rotary planar, in which case co-ordinates of the planar linear geometry of winding shape are transposed to polar co-ordinates.

The invention also embraces a method of providing a printed circuit winding for a screened inductance sensor having a drive winding for establishing a drive field, at least one sense winding in which a voltage may be induced in the presence of said drive field, and at least one conductive screen within which eddy currents are generated in the presence of said drive field to establish a counter-field opposing said drive field, said at least one conductive screen and said at least one sense winding being displaceable relative to one another in a single direction within said drive field so that said at least one sense winding may be shaded by said at least one conductive screen to a varying extent to thereby vary the voltage induced in said at least one sense winding, the method comprising the steps of:

(a) defining a single-turn winding for a planar linear geometry, said single-turn winding having a width which varies in said single direction of relative displacement of said at least one conductive screen and said single-turn winding so that the area swept out by notional relative displacement of said at least one conductive screen and said single-turn winding in a direction equivalent to said single direction of relative displacement follows a specified transfer function, (b) transforming said planar linear geometry of said single-turn winding to a winding shape appropriate to specified requirements of the sensor, and (c) outputting the transformed winding shape to provide printed circuit artwork.

A printed circuit winding for a screened inductance sensor having a drive winding for establishing a drive field, at least one sense winding in which a voltage may be induced in the presence of said drive field, and at least one conductive screen within which eddy currents are generated in the presence of said drive field to establish a counterfield opposing said drive field, said at least one conductive screen and said at least one sense winding being displaceable relative to one another in a single direction within said drive field so that said at least one sense winding may be shaded by said at least one conductive screen to a varying extent to thereby vary the voltage induced in said at least one sense winding, may in addition be provided by a method comprising the steps of:

(a) defining a multi-turn winding for a planar linear geometry, said multi-turn winding having a shape enabling the area swept out by notional relative displacement of said at least one conductive screen and said multi-turn winding in a direction equivalent to said single direction of relative displacement to follow a specified sensor transfer function.

(b) transforming said planar linear geometry of said multi-turn winding to a winding shape appropriate to specified requirements of the sensor, and (c) outputting the transformed winding shape to provide printed circuit artwork.

In another aspect, the invention provides apparatus for producing a printed circuit winding for a screened inductance sensor including (a) means for defining a winding shape for a two pole planar linear geometry for specified requirements of the winding, (b) means for transferring said two pole planar linear geometry of winding shape to a winding shape appropriate to specified requirements of the sensor, and (c) outputting said transformed winding shape to provide printed circuit artwork.

In a still further aspect, there is provided according to the invention a screened inductance sensor having a printed circuit winding produced by (a) defining a winding shape for a two pole planar linear geometry for specified requirements of the winding, (b) transferring said two pole planar linear geometry of winding shape to a winding shape appropriate to specified requirements of the sensor, and (c) outputting said transformed winding shape to provide printed circuit artwork for said winding.

According to a second aspect of the present invention, there is provided a sensor comprising a drive or exciting winding for establishing a forward or drive field, at least one secondary or sense winding in which a voltage may be induced in the presence of said forward or drive field, and at least one conductive screen within which eddy currents are generated in the presence of said forward or drive field to establish a counter-field opposing said forward or drive field, said at least one conductive screen and said at least one secondary or sense winding being displaceable relative to one another within said forward or drive field so that said at least one secondary or sense winding may be shaded by said at least one conductive screen to a varying extent to thereby vary the voltage induced in said at least one secondary or sense winding, and barrier means being interposed between the windings of the sensor and said at least one conductive screen so that said at least one conductive screen may be disposed within a region environmentally isolatable from the region in which said drive or exciting winding and said at least one secondary or sense winding are located, wherein said barrier means comprises a stator portion on which said drive or exciting winding and said at least one secondary or sense winding are disposed, and said stator portion has means for guiding displacement of said at least one conductive screen for said shading of said at least one secondary or sense winding.

Said stator portion may have a peripheral region for sealing engagement against a wall portion defining a boundary portion of said region environmentally isolatable from the region in which said drive or exciting winding and said at least one secondary or sense winding are located. Said peripheral region is suitably flangingly engageable against said wall portion. Said stator portion may be generally planar and have a substantially cylindrical spigot portion on which said drive or exciting winding is located. Said at least one secondary or sense winding is preferably a printed circuit winding and is accommodated within an interior region of said substantially cylindrical spigot portion, while said at least one conductive screen may be a sectoral portion of a disk.

In an alternative configuration, said stator portion is generally cylindrical and is of top-hat configuration in sectional view, the rim portion of said top-hat configuration stator portion defining a peripheral region for sealing engagement against a wall portion defining a boundary portion of said region environmentally isolatable from the region in which said drive or exciting winding and said at least one secondary or sense winding are located. Said drive or exciting winding and said at least one secondary or sense winding may then be located about the external periphery of the cylindrical portion of said top-hat configuration stator portion. Said at least one secondary or sense winding is again preferably a printed circuit winding laid on a flexible substrate, while said at least one conductive screen may be a sectoral portion of a cylinder.

In rotational arrangements of the sensor, said means for guiding displacement of said at least one conductive screen may be an axle or pin, and the sensor may include a screen or rotor assembly rotatingly mounted on said axle or pin. In a linear displacement adaptation, the sensor suitably includes a screen or float assembly housing having wing or flange portions, and said stator portion has grooves or slots for guiding engagement of said wing or flange portions. In a cylindrical configuration, said stator portion comprises a substantially cylindrical tube and a generally co-axial outer sleeve surrounding said substantially cylindrical tube, one axial end of said substantially cylindrical tube being axially aligned with an axial end of said generally co-axial outer sleeve and the annular space between the tube and the sleeve at said one axial end being spanned by a substantially annular closure member, and the other axial end of said substantially cylindrical tube being closed off by a substantially disk-shaped closure member, said drive or exciting winding and said at least one secondary or sense winding being located within said annular space between the tube and the sleeve, and said at least one conductive screen being defined by a float member axially displaceable within said tube, the inner surface of said substantially cylindrical tube defining said means for guiding displacement of said at least one conductive screen.

The invention also encompasses a level gauge for a container for holding liquid, a boundary of said container being defined by at least one wall portion, and said level gauge including a drive winding for establishing a drive field, at least one sense winding in which a voltage may be induced in the presence of said drive field, and at least one conductive screen within which eddy currents are generated in the presence of said drive field to establish a counter-field opposing said drive field, said at least one conductive screen and said at least one sense winding being displaceable relative to one another within said drive field so that said at least one sense winding may be shaded by said at least one conductive screen to a varying extent to thereby vary the voltage induced in said at least one sense winding, said drive winding and said at least one sense winding being disposed in juxtaposition to an external surface region of said at least one wall portion, means for guiding displacement of said at least one conductive screen relative to said at least one sense winding being provided on an internal surface region of said at least one wall portion, said wall portion defining barrier means interposed between the windings and said at least one conductive screen so that the windings are located in a region environmentally isolated from the region in which said at least one conductive screen is located, and the level gauge also including float means associated with said at least one conductive screen so that said at least one conductive screen is displaced relative to said at least one sense winding as the level of liquid in the container changes.

In a still further aspect, the invention includes a two-terminal sense winding for a screened inductance sensor having a drive winding for establishing a drive field, at least one sense winding in which a voltage may be induced in the presence of said drive field, and at least one conductive screen within which eddy currents are generated in the presence of said drive field to establish a counter-field opposing said drive field, said at least one conductive screen and said at least one sense winding being displaceable relative to one another in a single direction within said drive field so that said at least one sense winding may be shaded by said at least one conductive screen to a varying extent to thereby vary the voltage induced in said at least one sense winding, said two-terminal sense winding comprising a plurality of generally concentric turns consisting of a multiplicity of segments interconnected so that the direction of notional current flow in each segment of said concentric turns corresponds to the direction of current flow in a notional corresponding two-terminal sense winding having a plurality of series-connected turns, each of which is displaced relative to preceding and/or succeeding series-connected turn in said single direction of relative displacement of said at least one conductive screen and said at least one sense winding. Said sense winding is suitably a printed circuit winding laid on a disc-form substrate for a rotary planar geometry of said sensor.

The present variants of screened inductance sensor are particularly suited to arrangements in which the various component parts of the device are moulded from thermoplastics or other easily formed material, such as aluminium. In this latter event, the component parts may be die cast. The particular configurations of sensor set out in the foregoing text and also subsequently described in more detail having regard to the drawings represent a selection of favoured configurations of device in accordance with the principles of the invention, but are not to be regarded as in any way limiting, while neither are the printed circuit preparation methods provided according to the first aspect of the invention in any way restricted to level gauge screened inductance sensors, although they may well find application in providing printed circuit winding configurations suitable for such units.

BRIEF DESCRIPTION OF THE DRAWINGS

The invention and its various aspects will now be described having regard to the accompanying drawings, in which:

FIG. 1 shows the basic elements of a screened..inductance transducer system in a planar configuration, while

FIG. 9 is a schematic diagram showing a fuel level measurement system incorporating a sensor according to the invention, FIG. 18 is a sectional view of a two-part sensor for mounting on a continuous tank wall without any aperture therein, FIG. 19 is a similar view to that of FIG. 18 of an alternative configuration of a two-part sensor for an integral tank wall lacking any opening therein.

FIG. 24 is a data input menu for the computer program of FIG. 23, FIG. 25 is a plotting menu for the computer program of FIG. 23, FIG. 26 shows one side of a printed circuit board produced by the method of the invention, together with its associated screen, for an elongated working stroke device according to the invention, FIG. 27 shows one side of a further example of a printed circuit board produced by the method of the invention, together with an associated screen, for a device having a sinusoidal modulation of the output.

FIG. 35 shows four crescent-shaped coils for a planar rotary sensor which are relatively circumferentially displaced in steps of 30°, while

DETAILED DESCRIPTION OF THE DRAWINGS

Figure 1:
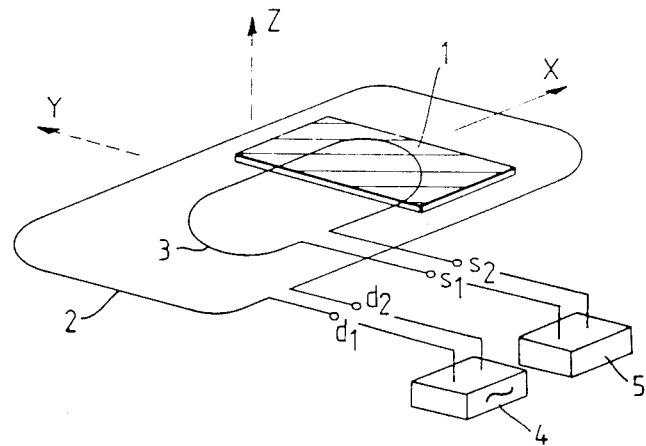
Figure 2:
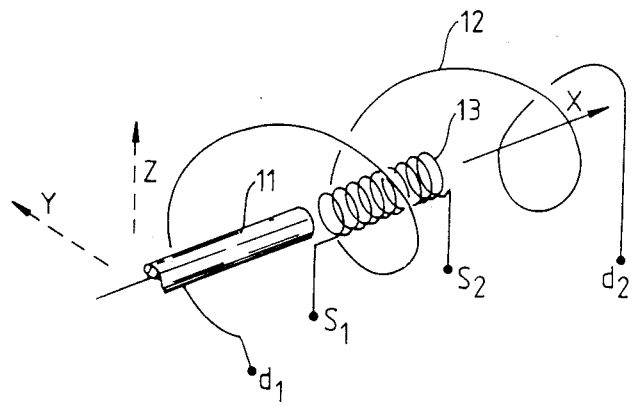
FIG. 2 shows the basic elements of a screened inductance transducer in a configuration in which the sense winding is solenoidal.

Elementary geometries of screened inductance transducer are illustrated in FIGS. 1 and 2, in each case showing a screen 1,11 respectively, a drive coil or winding 2,12, which in operation is normally excited by an oscillator, indicated schematically by reference 4 in FIG. 1 only, and a sense, or measurement, coil or winding 3,13. Also depicted in schematic manner in FIG. 1 is a signal processing means 5, adapted to receive signals from the sense winding 3 of the sensor and operate on them as required in order to provide a desired output, or outputs, which may be indicative of screen position, the rate of screen displacement relative to the sense winding, or both. While it is desirable that the screen 1,11 be physically interposed between the windings 2,3 or 12,13, this is not a necessary condition for operation. As the screen 1,11 moves, it shades the sense coil 3,13 from the drive field to a varying extent and hence controls the voltage induced in it. The difference between the planar and solenoidal configurations shown in FIGS. 1 and 2 is practical rather than fundamental, but mental images of both configurations are desirable, since every device encountered in practice can be readily identified as a development of one or the other arrangement.

Figure 3:
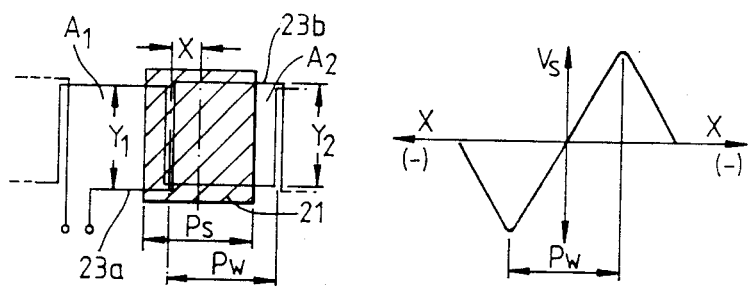
FIG. 3 shows a winding/screen combination for piecewise linear output signal modulation.
Figure 4:
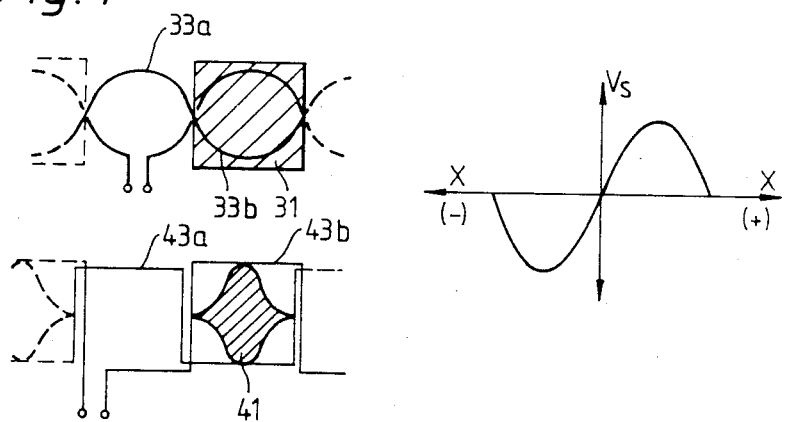
FIG. 4 shows two alternative winding/screen combinations for sinusoidal output signal modulation.
Figure 5:
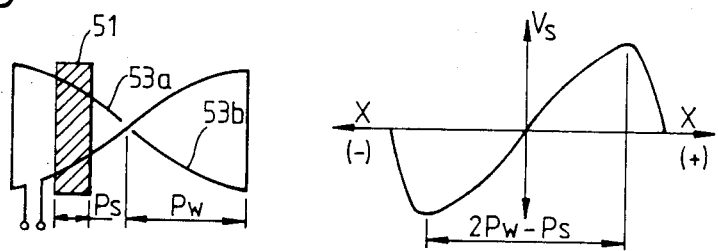
FIG. 5 shows a winding/screen combination for an elongated working stroke screened inductance device.

Transducer output from a screened inductance sensor is essentially an amplitude modulated carrier frequency. The carrier component is normally removed in a first stage of signal processing by synchronous demodulation. The transfer function relating the input variable to signal magnitude is the most important characteristic of any position measuring device. In the case of a screened inductance sensor, the transducer's transfer function is related to the shapes of the sense windings 3,13 and the screens 1,11. Clearly an infinity of combinations are possible, but in practice these can be reduced to a small number of categories. The three most important of these categories and their respective outputs are illustrated in FIGS. 3, 4 and 5, while an overview of screened inductance sensor classification is given in subsequent FIG. 6. All of the sense windings shown are composed of alternate turns of clockwise and anti-clockwise phase, respectively 23a, 23b; 33a, 33b; 43a, 43b; and 53a, 53b, which is a technique used in most practical transducers. It eliminates a DC bias on the output which would otherwise be present. The arrangements of FIGS. 3 and 4 have a common feature in that the screen 21, 31, 41 and sense winding 23a, 23b; 33a, 33b; 43a, 43b pitches, Ps and Pw respectively, are substantially equal. The rectangular sense winding or coil 23a, 23b and rectangular screen 21 of the FIG. 3 configuration result in a piecewise linear modulation of the output, i.e. linear sections of alternate rising and falling slopes. The local proportionality between input and output results in simple signal processing in many situations.

Drive winding means to create an even field distribution over the area of the sense winding 23a, 23b is assumed. The configuration of the device ensures that sense winding area is uncovered at a constant rate with screen position, the rate abruptly reversing after the screen has reached the point of fully covering one of the sense coils of the winding. In practice, a certain amount of rounding of the peaks of the output waveforms is inevitable, as indicated in the output signal represented in FIG. 3. However, good linearity is achievable over a substantial portion of the ramp waveform, with proper design.

The FIG. 4 arrangement, in either of the two variants shown, provides a device with a sinusoidal transfer function, the modulation envelope being designed to be a sinusoidal function of screen position. The advantage of this is that there is a wide selection of commercially available converters which will derive a digital position signal or word from amplitude modulated sine/cosine information. As shown schematically in FIG. 4, the derived modulation envelope can be achieved with a rectangular screen 31 and shaped windings 33a, 33b or by a shaped screen 41 and rectangular windings 43a, 43b, or indeed by a shaping of both elements. Generally speaking it is favourable to choose designs where screen area predominates over winding area, and therefore practical designs will tend to take the form of the rectangular screen and shaped coil. The end result in any case should be to ensure that the nett flux linkage of the sense winding varies in a sinusoidal manner with screen position.

Both piecewise linear type and sinusoidal modulation systems are particularly suitable for situations where the basic transducer element forms part of a multipole system, or where it closes on itself, as in rotary designs. However, for simple limited motion transducers using only the central monotonic section of the output signal, either of these designs suffers from a disadvantage: a full winding pitch, 2 Pw, and hence the length of the transducer, is twice the length of the central active portion of the output waveform. This disadvantage is overcome in the type of transducer shown in FIG. 5 where a short pitched screen 51 and a shaped sense winding 53a, 53b are used, giving an active region of length 2 Pw–Ps, as shown.

This final category is denoted as 'Elongated Working Stroke', and the screen 51 pitch $P_s$ is deliberately chosen to be considerably shorter than the sense winding 53a, 53b pitch $P_w$. This generally results in a device with lower gain, but the demodulated output, as a function of screen position, has a central monotonic region of approximate length $2P_w-P_s$. This is favourable for limited motion devices, and the examples subsequently described herein relate to this type of screened inductance sensor. Generally the sense windings 53a, 53b take the form of a pair of substantially triangular loops meeting at a common apex, and the screen pitch, Ps, is made significantly less than the winding pitch, Pw. The modulation envelope is normally determined by the shape of the sense winding, which characteristically will have the tapered form of FIG. 5. While screening efficiency and hence achievable accuracy tends to be reduced in this configuration, this is not necessarily disadvantageous in the applications to which elongated working stroke designs are suited.

Figure 6:
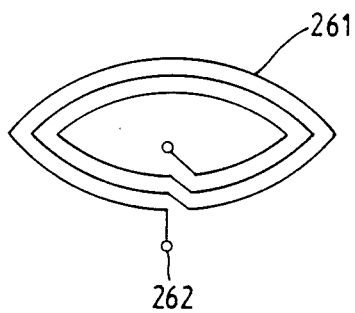
FIG. 6 shows a multi-turn distributed sense winding having "concentric" turns of diminishing physical size.

The sense windings of screened inductance sensors may have a single turn, as in the schematic arrangements of FIGS. 3, 4 and 5, or a multi-turn configuration may be used. In this case, each sense winding or sense winding coil may have several conductors, all contained in a single slot, or each coil may consist of a distributed winding, to achieve special output characteristics and take account of dimensional characteristics. In general, sensitivity is increased by a multi-turn arrangement. A distributed multi-turn winding of generally sinusoidal configuration and comparable with the upper single-turn arrangement of FIG. 4, is shown in FIG. 6. The coil has the form of an array of elongate concentric curvilinear turns, the longer axis of each of which is aligned with the direction of relative displacement of the screen and secondary winding. The winding thus has a track 261 with a plurality of turns extending inwardly from start 262, to terminate in a central region of the winding at end 263. A similar outwardly extending track is provided on the opposite side of a single circuit board, for symmetry, and to cancel the effect of cross-overs.

Thus, the distributed winding arrangement of FIG. 6 is distinguished by "concentric" turns of diminishing physical size. This configuration is advantageous in exploiting space, but has an inherent sensitivity to non-ideal screen behaviour. In winding design, therefore, in which, ideally, uniform screening is initially typically assumed, an alternative procedure is needed to refine the design of a distributed arrangement of this kind to a selected target level of precision.

Figure 7:
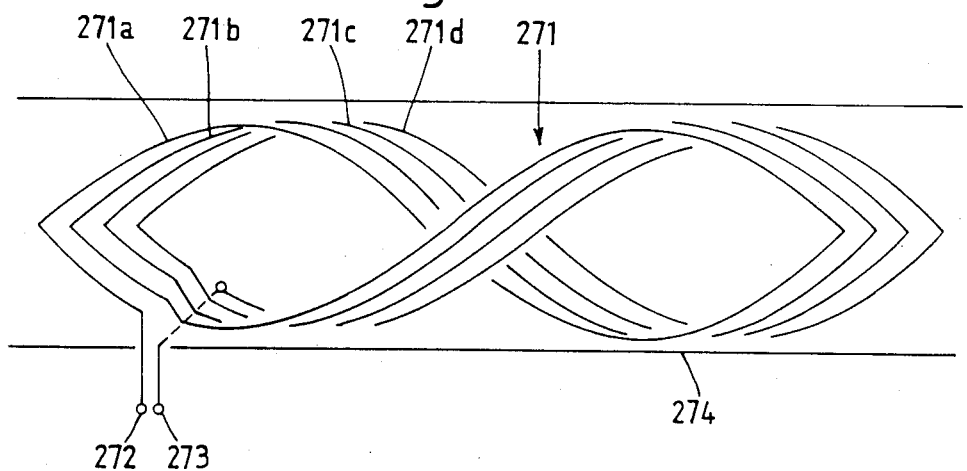
FIG. 7 shows a multi-turn sense winding with phase and anti-phase coils, each made up of an array of substantially identically but physically displaced turns to provide an alternative configuration of distributed winding.

An alternative layout of distributed winding is shown in FIG. 7, in which an array 271 of displaced turns is provided, extending between start 272 and winding end 273. Each turn 271a, 271b, 271c and 271d is of the same size and shape, and the winding is laid out on a multi-wrap thin flexible substrate 274. While less economical in its use of space, a winding of this kind has an inherent ability to reduce harmonic content in the demodulated output wave. The design of a winding of this kind may also be achieved with a lesser number of iterations.

The screen/winding combinations shown in planar form in FIGS. 3, 4 and 5 all have equivalents in solenoidal geometries, as disclosed in detail in a co-pending application. Piecewise linear modulation may be achieved by use of a cylindrical screen and a constant axial turn density in a solenoidal sense winding, with phase reversal occurring centrally along its axial extent.

Sinusoidal modulation may be achieved by a shaped double-tapered screen co-operating with a constant density solenoidal sense winding, or alternatively, a cylindrical screen of constant cross-section may be employed in conjunction with a solenoidal sense winding in which the lineal turn density varies sinusoidally. A solenoidal elongated working stroke configuration with a cylindrical screen and sense winding may also be provided.

The foregoing exemplifications of screened inductance sensors represent preferred embodiments of the screened inductance principle, in which it is important for the drive field to have a substantially even distribution over the area of the sense winding in the absence of the screen, at least on the axis of motion. For example, in the case of a linear planar device, the drive field should have a constant value along any line in or parallel to the direction of relative screen and sense winding displacement, although it may vary at right angles to the direction of motion, so that the field density on any given such line is not necessarily the same as that along another and parallel line.

Figure 8:
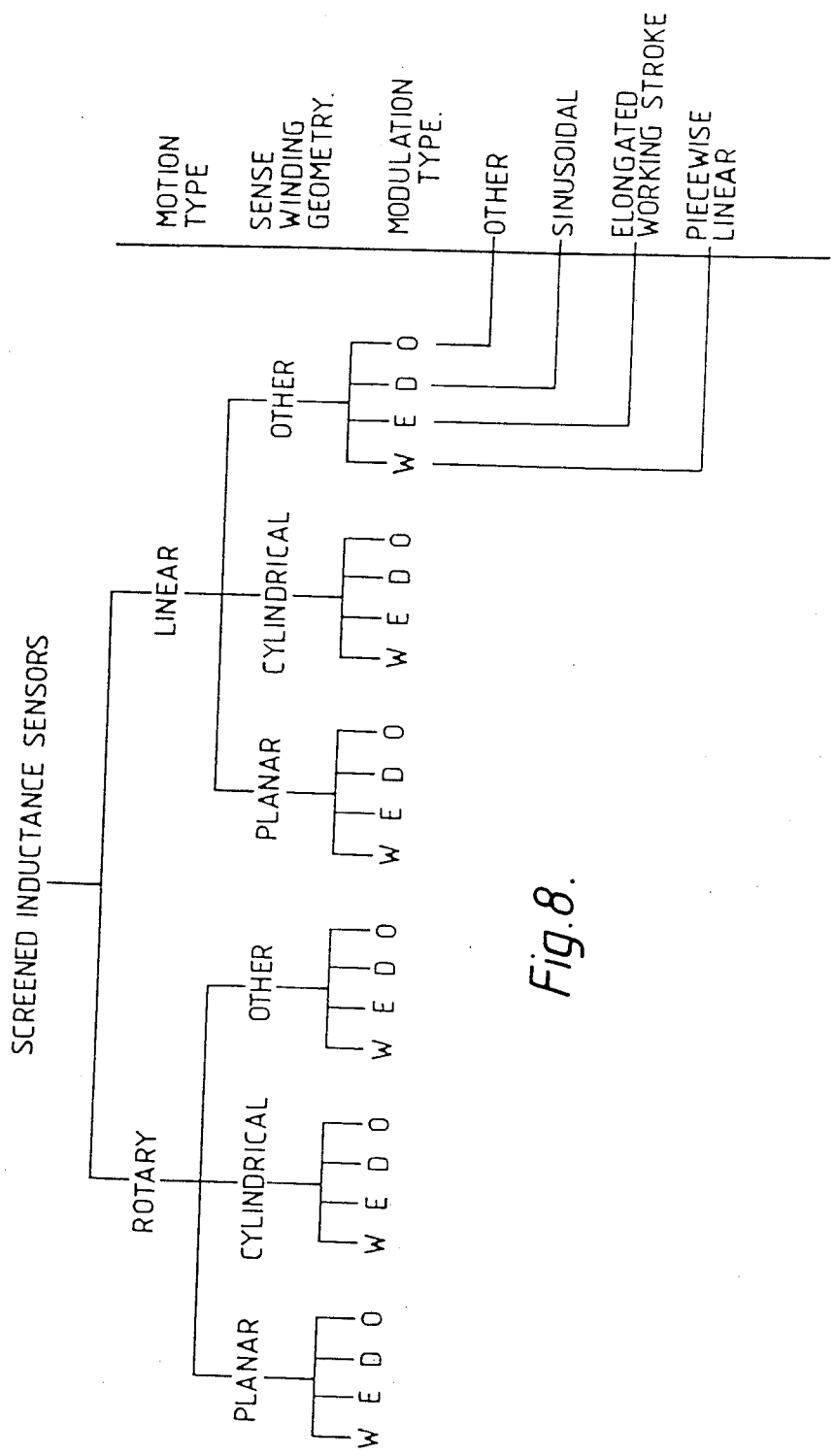
FIG. 8 is a chart setting out the various categories into which screened inductance sensors may be classified, including, inter alia, those of FIGS. 3, 4 and 5.

While screened inductance transducers can be classified on many different parameters, the categorisation illustrated in FIG. 8 has been found to give a clear description of a measurement system:

(a) Measurement axis: Motion is either rotary or linear.

(b) Sense winding surface : The sense winding is laid on either a planar surface, a cylindrical surface, or some other surface.

(c) Modulation envelope : piecewise linear (W), sinusoidal (D). elongated working stroke (E), or other (0).

These categorisations give rise to the hierarchy of devices as set out in FIG. 8.

The basic design equation for screened inductance sensors has been established for planar type windings, with some simplifying assumptions, to be:

$$V's = kA \tag{1}$$

where V's is the demodulated output, 'k' is a constant for a particular transducer indicative of the geometry and excitation levels, and 'A' is the unscreened area of sense coil. In the case of double coil windings. 'A' will be the net unscreened area, considering, for example, clockwise loops to enclose positive area and counter-clockwise loops to enclose negative area. In some circumstances, it is favourable to differentiate equation (1) with respect to the position variable, giving $$\frac{dV's}{dx} = k\frac{dA}{dx} \tag{2}$$

Stated in words, this says that the slope, or shape, of the modulation envelope is determined by the rate at which sense coil area is uncovered. Both this and equation (1) clearly show the fundamental design simplicity of screened inductance sensors. The rate at which unscreened area of sense coil is uncovered will be determined by the shape of the screen and the shape of the sense coils, both of which can be easily controlled.

The design method of the present invention, in one of its aspects, may be illustrated in connection with a screened inductance sensor for indicating fluid level measurement in a fuel tank. The particular configuration in question has the advantages of simplicity and clarity. This practical embodiment of screened inductance sensor is described by way of example and does not represent a definitive statement as to how and where devices according to the invention should be used.

FIG. 9 shows the overall level measurement system, including a fuel tank 64 with a rotary sensor 61 and ballcock 62, 63 arrangement. The fuel level is deduced from the angle of the float arm 63. The limited-angle rotary transducer 61 is used in association with float 62 and lever arm 63 to measure the liquid 65 level within the tank 64. Fluid level will be given by $$D = d - r\cos\theta \tag{3}$$

This is essentially the method used in most conventional systems, with the angle $\theta$ being measured by a brush type potentiometer. However, any sliding contacts are clearly a potential source of problems. The screened inductance sensor offers the possibility of brushless operation and intrinsic safety, as will be shown. The device may also be designed to have a complementary transfer function, (arc Cos), to give an overall linearisation of system response.

Figure 10:
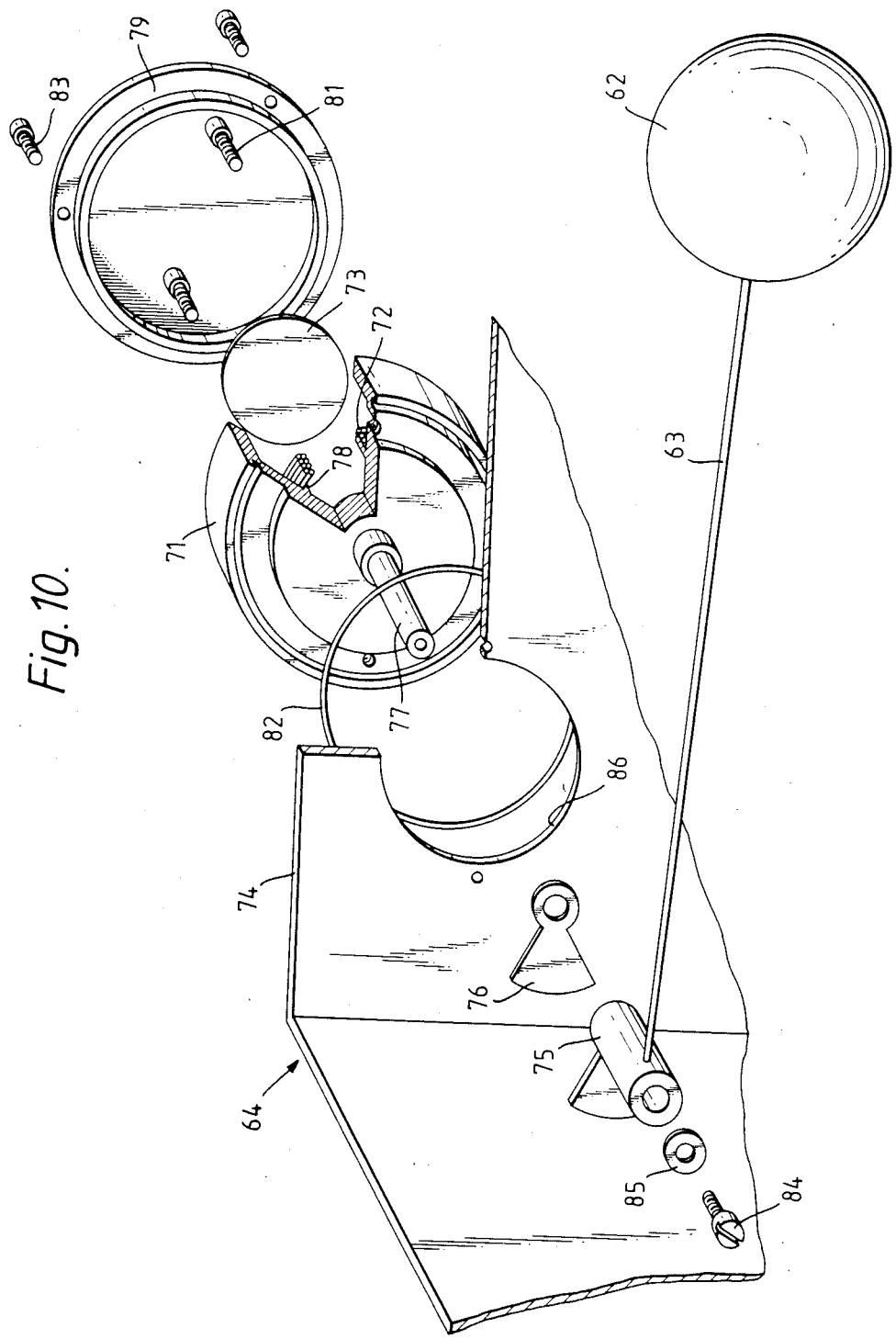
FIG. 10 is an enlarged exploded view of a portion of the arrangement of FIG. 9, showing detail of the sensor of the invention.

A practical construction of the transducer 61 of FIG. 9 takes the form shown in FIG. 10. A stator 71 containing drive 72 and sense 73 windings is attached to the outer side of wall 74 of the tank 64, to overlie and externally occlude and seal off aperture or bore 86 in wall 74, while a rotor-float assembly 75 including a screen 76, arm 63 and float 62 pivots around a central stator shaft or axis 77, inside the tank 64. Pivot pin or axis 77 extends into the interior of the tank 64, through aperture 86, from external stator 71. Shaft 77 may be integral with stator 71. Thus there are no sliding contacts, or in fact any active components whatsoever, in contact with the liquid or fuel 65. The drive coil 72 is wound on a spool portion 78 of the stator, and surrounds the printed circuit board 73 which defines the sense windings. The design of the latter is at the heart of the system of the invention and will be described in detail in a following section. The stator 71 and rotor 75 are very suitable for manufacture as injection moulded plastic parts. The screen 76 may be punched copper sheet or an aluminium die casting. Alternatively, the central part of the rotor 75 may be made entirely as an aluminium die casting, thus eliminating the need for a separate screen 76. End cap 79 may also be made as an injection moulding or a die casting. Thus all parts are suitable for high-volume, low-cost manufacture. FIG. 10 also shows and identifies other component parts of the fuel level sensor, including fasteners 81 for securing the stator to the tank wall 74, an O-ring 82 for sealing the stator against the tank wall in leak-proof manner, end-cap securing and locating screws 83 for mounting the end cap on the main stator structure 71, and a rotor location or retaining screw 84 and washer 85, for securing the rotor-float assembly 85 to stator shaft 77 in a pivotably-mounted manner. As shown in FIG. 10, the assembled unit is mounted to cover opening or aperture 86 cut in the wall 74 of the tank 64. The barrier-defining stator 71 covers over the hole 86 in a sealing manner on the exterior of the tank, while the rotor-float assembly is pivotably secured to shaft or spigot 77 so that it is disposed within the tank. Shaft or spigot 77 is a rigid component preferably integral with stator 71 and rotor-float assembly pivots about spigot 77 in operation of the unit. There is no physical transmission of rotor-float assembly 78 motion to those parts of the unit external of the tank.

Figure 11:
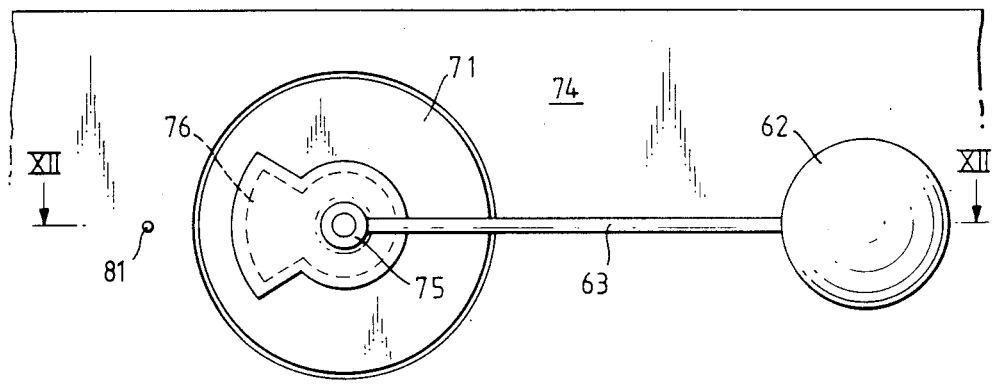
FIGS. 11 and 12 show further detail of the sensor of FIG. 10, in an end or front view and an axial sectional top view respectively.
Figure 12:
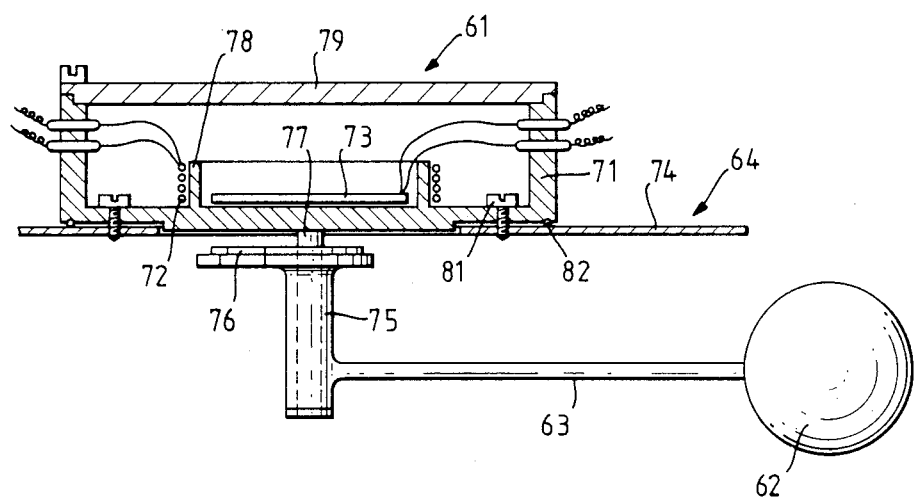

FIG. 10 thus shows an assembly of a suitable rotary—planar geometry. The motion of the measurement arm 63 causes rotational displacement of screen 76. The screen 76 is a segment of a disc, the size of the screen being determined by the extent of the associated sense windings 73. The stator 71 is attached to the outside of the tank wall 74 by screws 81 or other fixing means. The stator 71 is provided with the projecting pin or spigot 77, which serves as a pivot for the measurement arm 63. Sealing between the stator 71 and tank wall 74 is provided by 'O' rings 82, gaskets, or liquid sealing compounds. The stator 71 and rotor 75 parts are suitably made from non-metallic, non-conductive materials. Many thermoplastics materials are suitable, especially because of the ease with which they may be moulded into complex shapes. Alternatively, the rotor assembly 75 may be made as an aluminium die-casting, thus eliminating the need for a separate screen. The stator 71 includes a supporting cylinder or spool portion 78 for a solenoidal drive winding 72. The sense windings 73 are laid out on a disc, which is contained within the stator unit radially inwardly of the drive winding. This sense winding disc 73 may typically be manufactured by printed circuit techniques. A ferrite flux return cup can optionally also be used. This may be covered by, or replaced with, a simple plastic or aluminium cover 79. FIGS. 11 and 12 show, respectively, an end or front and a sectional view of the transducer of FIGS. 9 and 10, the sectioned view of FIG. 12 being substantially on the line XII—XII of FIG. 11.

Figure 13:
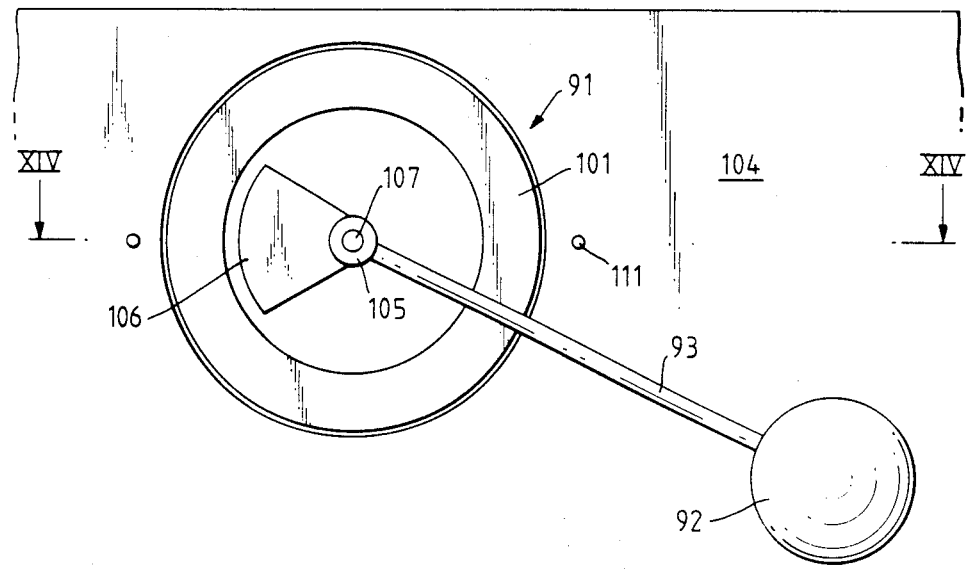
FIGS. 13 and 14 show an alternative rotary-cylindrical construction of sensor according to the invention, in an end or front view and an axially sectioned top view respectively.
Figure 14:
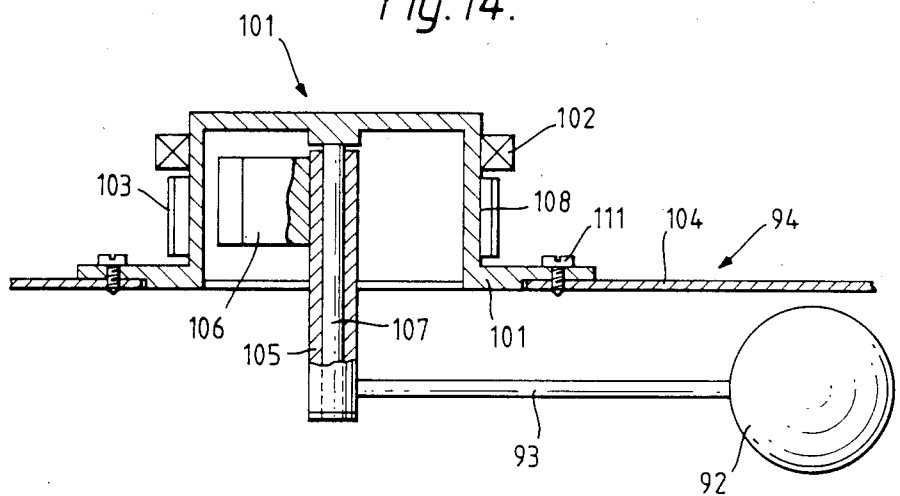

The ease with which rotary-planar geometry can be adapted to the use of printed circuit windings makes it a natural choice for many applications. However, other geometries are possible. FIGS. 13 and 14 show, in front view and axial section on line XIV—XIV of FIG. 13 respectively, a rotary-cylindrical device 91 in accordance with the invention. In this case, the screen 106 is a segment of a cylinder and the sense windings 103 are laid on a surrounding cylindrical surface 108. They may be formed by printed circuit techniques on a flexible substrate and subsequently wrapped around the stator 101, or alternatively they may be wound directly into slots or around pegs.

As shown in these Figures, this embodiment of transducer 91 according to the invention is mounted on a tank 94 and has a float 92 with a lever arm 93. The stator 101 is of generally top-hat configuration. with a flange portion fastened to the wall 104 of tank 94 by screws 111. Suitable sealing means is provided between the inner side of the flange and the outer side of wall 104. Drive winding 102 is a cylindrical coil of short axial length and is mounted on the exterior of the cylindrical portion of stator 101, near its end remote from tank wall 104. Sense winding 103 is laid on the remaining axially extending region of surface 108, between the outwardly disposed drive winding 102 and the flange of the top-hat section stator 101. The arm 93 connected to float 92 is mounted at its other end on a rotor assembly 105. Rotor assembly 105 carries the cylindrically segmental screen 106. The entire rotor assembly 105 and screen 106 are rotationally displaceable about an axis defined by a spindle 107 extending inwardly into the tank from the interior of the outer closed-off end of the top-hat section stator 101. The functioning of the device so far as its electrical operation is concerned substantially equates to that of the linear planar construction already described. As in the case of the previous construction, the screen and the various other portions of the device which are located within the region containing the liquid, the level of which is to be measured, are physically separated from the remainder of the device, and in particular from the drive 102 and sense 103 windings, by means of a physical barrier defined by stator 101. Apart from the use of a rotational cylindrical geometry in place of the planar rotational configuration of the earlier embodiment, the arrangement of FIGS. 13 and 14 differs from that of FIGS. 10, 11 and 12 in that the liquid enters into the space within the top-hat form sensor housing or stator 101. Again however, there is no physical communication or link between the liquid-immersed interior and the winding-equipped exterior of the unit.

Figure 15:
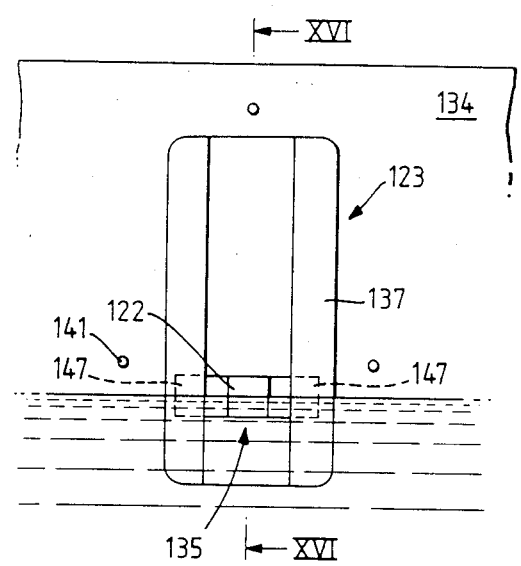
FIGS. 15 and 16 show a planar-type sensor according to the invention, in front and side sectional views respectively.
Figure 16:
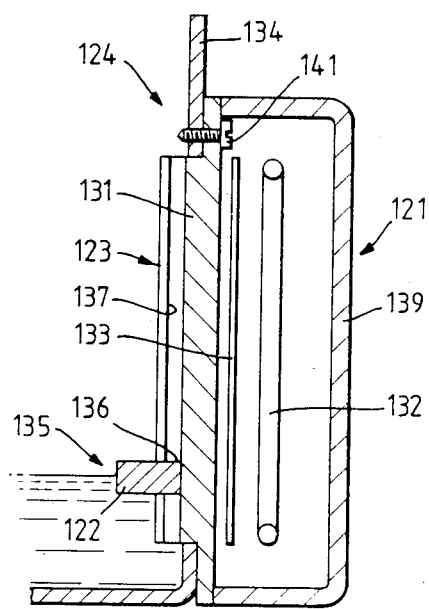

Linear transducers can also be used as level transducers, although their larger size may render them less advantageous. FIGS. 15 and 16 show a planar configuration of level gauge, FIG. 15 in front view and FIG. 16 in section on the plane XVI—XVI of FIG. 15, while FIG. 17 shows a cylindrical type.

In the arrangement of FIGS. 15 and 16, the transducer 121 again has portions which are located within the liquid-containing space and other portions which are separated from that space by means of a barrier-defining stator portion. Thus sensor 121 has a barrier-defining stator portion 131 of generally plate form, which is secured to wall 134 of tank 124 by means of screws 141. Stator 131 has a float guiding portion 123, which extends inwardly from the outer plate-form portion of the stator into the liquid-containing space. In this configuration, float 122 together with screen 136 form a single assembly 135 and screen 136 has lateral wing portions 147 which engage within vertically extending grooves or slots 137 in stator portion 123 so as to guide the float assembly 135 during upward and downward displacement, according as liquid level rises and falls. Outwardly of stator or barrier plate 131, the device has drive 132 and sense 133 windings, and the entire unit is closed off from the ambient environment on this exterior side by an end cap 139. Again the sense windings 133 are suitable for manufacture by printed circuit techniques. Operation of the device is again substantially equivalent in electrical terms to that of the rotary planar and rotary cylindrical devices already described, and a configuration in which the screen assembly is physically sealed off from the remainder of the device is again provided, by virtue of the sealing engagement of stator plate 131 against wall 134 of tank 124.

Figure 17:
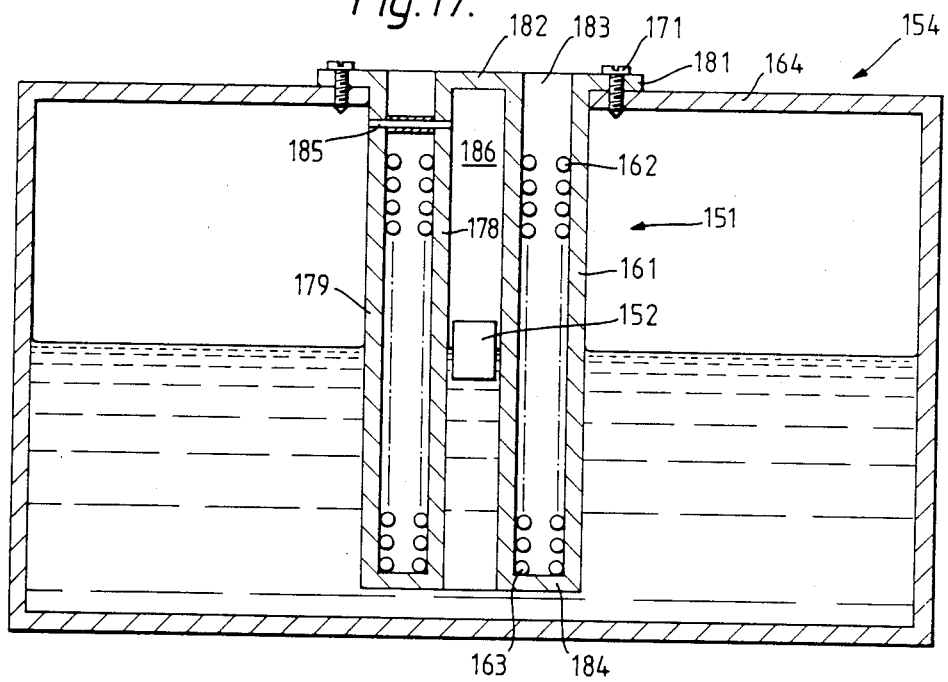
FIG. 17 shows a linear-cylindrical configuration of sensor incorporating principles of the present invention, in sectional view.

FIG. 17 depicts in sectional view a cylindrical configuration of device (151) in accordance with the invention, in which stator 161 is substantially defined by a pair of co-axial tubular portions 178, 179, one (179) of which surrounds the other, 178. The outermost tube 179 has a flange portion 181 at its outer end, by means of which the stator 161 is secured to wall 164 of tank 154 by fasteners 171. The outer end of the inner tube portion 178 of the device is closed off by an end plate portion 182. The annular space 183 between the inner 178 and outer 179 tube portions is closed off at the inner end of the device, remote from the flange portion and the end cap of the inner tube, by annular inner end plate 184. The device is oriented on tank 154 so that its longitudinal axis extends in a substantially vertical direction. A float 152 consisting of a hollow cylinder of copper or aluminium moves upwardly and downwardly within the inner tube 178. A vent aperture 185 communicates between the interior 186 of the central tube 178 and the exterior of the outer tube portion 179 to vent air from within the inner tube 178 during float displacement. The drive 162 and sense 163 windings are generally solenoidal and concentric and are located within the annular space 183 between the inner 178 and outer 179 tube portions of stator 161. Operation of the device is again electrically in line with that of the arrangements already described and also as set out in co-pending patent applications directed to other variants of screened inductance sensor. As in the case of the other arrangements described in the present application, the screen of the device, defined by float 152, is physically separated from the remainder thereof by a barrier defined by the two-part convoluted tubular stator 161.

In the embodiments previously described, the sensor of the invention is provided as an integral unit, for mounting over an opening cut in the wall of the tank in sealing engagement with the wall around the periphery of the opening. In the alternative configurations of FIGS. 18 and 19, the sensor of the invention is adapted for application to an integral tank wall uninterrupted by any opening or aperture.

The arrangement of FIG. 18 corresponds broadly in concept to that of FIGS. 13 and 14. Tank wall 294 is provided with an outwardly directed deformed region or "dimple" 306, of generally cylindrical configuration and closed off at its outer end by disc-shaped wall portion 299. Such a deformed region may readily be formed during production of the tank or tank wall, especially in the case of a tank moulded from plastics material. Cylindrical or annular drive 292 and sense 293 windings are mounted on the exterior of portion 306. A central spigot or shaft 297 affixed to end wall region 299 or formed integrally therewith extends along and through the cylindrical space bounded by wall portion 306 to and into the main liquid-containing region of the tank. A rotor/float assembly sleeve 295 is retained on shaft 297 for rotation relative thereto by an end cap or screw 303. Cylindrically-sectoral form screen 296 is attached to, mounted on, or formed integrally with, sleeve 295. Float arm 283 extends radially from the tank space end of sleeve 295 and terminates at float 282. Operation of the device is as already described for FIGS. 13 and 14.

FIG. 19 shows a configuration similar in general concept to that of FIG. 18, but of planar construction and broadly equivalent to the demountable unitary embodiment of FIGS. 10, 11 and 12. Tank wall 324 is uninterrupted by either apertures or deformations. Drive 322 and sense 323 windings are affixed to the exterior of the wall portion 324, drive winding 322 being a ring-shaped coil and sense winding 323 of a flat printed circuit disc-shaped configuration to be described. Coaxially with windings 322 and 323, spigot 327 extends inwardly from the inner surface of wall portion 324, to which it is affixed or otherwise secured, or with which it may be integrally formed. Sleeve 325 is rotatably mounted on spigot or shaft 327, on which it is held axially by end cap or screw 333. Sector-form disc screen 326 extends radially from the end of sleeve 325 adjacent wall 324, while at the other end of the sleeve, float arm 313 extends radially and terminates at float 312. Operation of the configuration of sensor equates to that already described for FIGS. 10, 11 and 12.

In general, screened inductance transducers can be designed to have any arbitrary transfer function relating the output to input. Three principal categories have been identified—piecewise-linear, sinusoidal and elongated working stroke. The latter category—elongated working stroke, where the screen pitch is shorter then the sense winding pitch—is generally advantageous for limited motion applications such as the level measurements described. However, for other barrier-type sensor applications where rotation is continuous or where linear motion is measured with multi-cycle transducers, other categories may be appropriate. In the particular case described of rotary devices used with a ballcock, resulting in a non-linear transfer function relating fluid level to the angle of the arm, it may be appropriate to design the screen/winding combination to give a complimentary modulation envelope, thus ensuring an overall linear transfer function between fluid level and signal output.

In all exemplifications of screened inductance sensor, a drive field is established by the single drive winding which is substantially even in the direction of motion of the screen relative to the sense windings. The sensor is thus largely immune to field variation across the axis of motion. It is however necessary for the drive field to have this substantially even or uniform distribution over the extent of the sense winding, in the absence of the screen, at least along individual paths swept out by points on the screen in the course of their normal motion, although a wholly uniform field distribution over the entire extent of the sense winding is not essential. Even field distribution in this sense also facilitates design of a screened inductance sensor for any given application. In particular, equations (1) and (2) above assume even field. In the case of a sensor in which a single cylindrical or solenoidal drive coil is used, paths of even or uniform field distribution prevail along circles centered on the axis of rotation and extend circumferentially around a notional cylinder on which the sense windings are then located. A comparable criterion applies to rotational planar configurations of screened inductance sensor. Suitable sense winding 53a, 53b and screen 51 shapes for the version of the transducer of FIGS. 10, 11 and 12 have been conceptually illustrated in schematic form in FIG. 5. A single turn version in planar rotary geometry has been described in a co-pending patent application. A multi-turn version of the same winding for a rotary geometry, laid out with the aid of a computer program, will now be described. This program takes outline winding dimensions as inputs, and produces layouts for final PCB artworks as outputs. The calculation of the winding shape is performed in two stages. Firstly, the winding shape is calculated for a planar two-pole geometry and, secondly, this shape is transformed to a rotary geometry with the correct number of poles.

Figure 20:
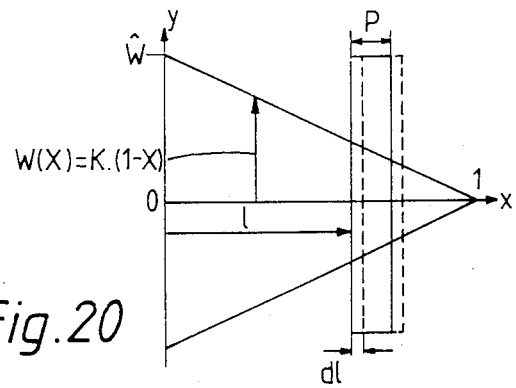
FIG. 20 is a diagram illustrating coil shape calculation for a single turn winding in an elongated working stroke configuration of screened inductance device.

In the example now discussed, a linear transfer function, i.e. linear modulation, is used for clarity and simplicity. However, the calculation procedure is substantially independent of modulation type. To achieve linear output, the winding is required to be basically triangular in shape, as illustrated in FIG. 20, and can be described by a simple equation $$w(x) = K(1-x) \quad 0 \leq x \leq 1 \tag{4}$$

where, for a single turn coil, in which W is the maximum winding height, constant K is defined by $$K = W$$

The basic equation describing the winding pattern is input into the design system (i.e. the computer) by the designer, and typically comes from a mixture of theory (as above), intuition and experience. Exemplary equation (4) provides a particular modulation envelope and other equations are used for different modulation envelopes (i.e. different transducer functions).

The relationship of equation (4) can be verified by considering the effect of a small change in screen position dl; this results in an increase in unscreened winding area dA, given by $$\begin{aligned} dA &= K(1-l)dl - K(1-l-P)dl \\ &= KPdl \end{aligned} \tag{5}$$

Figure 21:
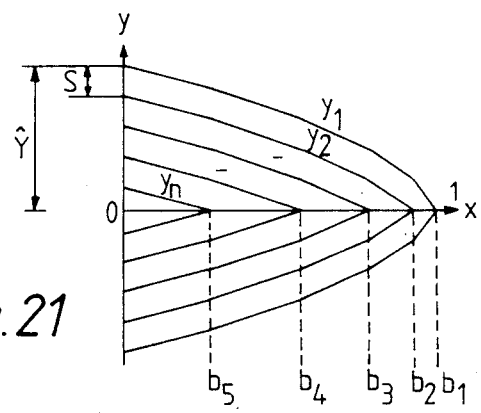
FIG. 21 is a diagram showing a multiturn winding in a linear planar geometry, for coil shape calculation in accordance with the method of the invention.

Thus $$\frac{dA}{dl} = KP, \text{ constant} \tag{6}$$

where P is the screen span or pitch in the direction of displacement, (FIG. 20). This function is constant, and since according to equation (2), it is the slope of the modulation envelope, there is therefore linear modulation, i.e. the transfer function is linear. To increase signal output levels, multi-turn windings, such as the concentric-shaped winding shown in FIG. 21, are required. In this regard, the concept of effective coil width may be introduced. This function, w'(x), may be defined as the sum of the coil widths, $y_1$ through $y_n$, where n is the number of turns at any value of x. FIG. 21, and is thus the rate of change of total coil area with x. This function must also follow equation (4) to give linear modulation. Thus, the winding shape must be defined by the following equation $$w'(x) = \sum_{i=1}^{n} y_i(x) \tag{7}$$

This function must have the same form as equation (4) to give linear modulation. Thus, the winding shape may be defined by the following equation:

$$\sum_{i=1}^{n} y_i(x) = K'(1-x) \tag{8}$$

This equation has an infinite number of solutions for $y_i$. Thus, the above equations may be satisified by an infinite set of "y" values, and therefore some extra constraints must be imposed in order to obtain a solution. The first and mandatory constraint comes from the overall winding dimensions and is the maximum winding height, Y, as shown in FIG. 21. This effectively sets the value of "$y_1$". The second and arbitrary constraint normally imposed is a constant spacing, s, between coils, an obvious choice for printed circuit windings. Alternatively, the spacing may vary over winding height or width, i.e. its dimension in the y direction. A final constraint is the total number of coils, N, which for obvious practical reasons is limited by the ratio of y to s, but is otherwise selectively variable within this upper limit.

Immediately, from the above constraints, an initial set of "y" values in equation (8) can be found for x=0. As x increases, the value of w'(x) falls at a constant rate, hence the set of "y" values also fall at a constant rate. It can be seen from FIG. 21 that for some value of x known as a break point, the inner "y" value reaches zero. At this point the number of turns is reduced by one and the other "y" values fall at a slightly faster rate. This process continues, dropping turns at the appropriate break points, until a full set of "y" values are obtained.

Thus, $$y_i(x) = y_1(x) - (i-1)s \tag{9}$$

Substituting this equation into (7), $$w'(x) = \sum_{i=1}^{n} (y_i(x) - (i-1)s) \tag{10}$$
$$= ny_1(x) - s\left(\frac{n}{2}\right)(n-1)$$

From (10), a value for K in terms of winding dimensions can immediately be obtained:

$$K = w(o) = NY - S\left(\frac{N}{2}\right)(N-1) \tag{11}$$

where
N=Total number of turns
and

Y = maximum winding width
= $y_1(0)$

If equation (10) is inverted an equation for $y_1(x)$ is obtained, and hence, all other values of $y_i(x)$.

$$y_1(x) = \frac{w'(x) + S\left(\frac{n}{2}\right)(n-1)}{n} \tag{12}$$

The final unknown to be solved for is n, which as seen in FIG. 21, is also a function of x. This function is defined by N break points, $b_i$, at each of which the y value reaches zero and n increases by 1. These are found by solving for $b_i$ for the N values of i in the following equations:

$$Y_i(b_i) = 0$$

i.e.

$$y_1(b_i) - (i-1)s = 0 \tag{13}$$

Thus n is defined as follows:

$$n(x) = i b_{i+1} < x \leq b_i \tag{14}$$

where $$b_{N+1} = 0$$

The final calculation procedure for this stage is then as follows: firstly, equation (11) is used to calculate the constant K in winding shape function w'(x). Next, there is an iterative search for N break points using equation (13). Finally, a set of $y_1$ values is calculated for a range of x values using equations (9) and (12), thus completely defining the winding shape for the first quadrant, FIG. 21. The winding shapes for the remaining three quadrants are derived by reflection of the first quadrant shape for the linear planar phase of the design procedure.

The second stage of calculation is the transformation from linear to rotary geometry. This involves mapping the x axis to a circle of radius r (FIG. 22) equal to the mean winding radius and the y axis to a radius, as illustrated in FIG. 22.

Thus, in the new $(r,\theta)$ co-ordinate system $$\theta = \frac{\pi}{2S} x \tag{15}$$

where S is the number of screens, and $$r = r + y \tag{16}$$

Figure 22:
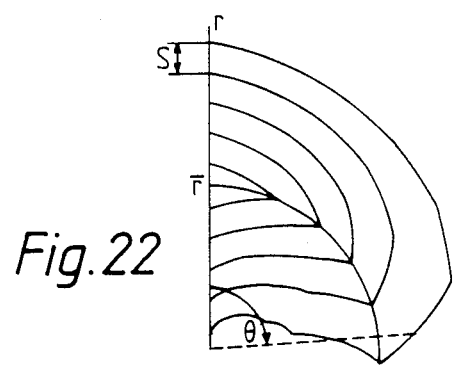
FIG. 22 illustrates transformation of the linear planar geometry multiturn winding of FIG. 17 into a rotary planar geometry, in accordance with the principles of the present invention.

The linear planar winding shapes shown in FIG. 21 for the first and second (clockwise) quadrants are thus transformed into the rotary planar half-winding shape of FIG. 22. This is the basic winding shape used to plot multi-turn concentric windings of the type shown in FIG. 22. The basic pattern is reflected about its apex to form the anti-phase turns and then appropriate end turns are added to the coils. For practical reasons, the winding must be spiral rather than concentric, hence the final artworks have crossover points at the $\theta = 0$ axis. In the final finished PCB's therefore, the winding spirals in towards the centre on one side of the board, crosses to the other side via a plated through hole, and then spirals out towards the edge again. This cancels the effect of the crossover points and means that the winding begins and ends at the same point, so preventing the introduction of offsets.

Figure 30:
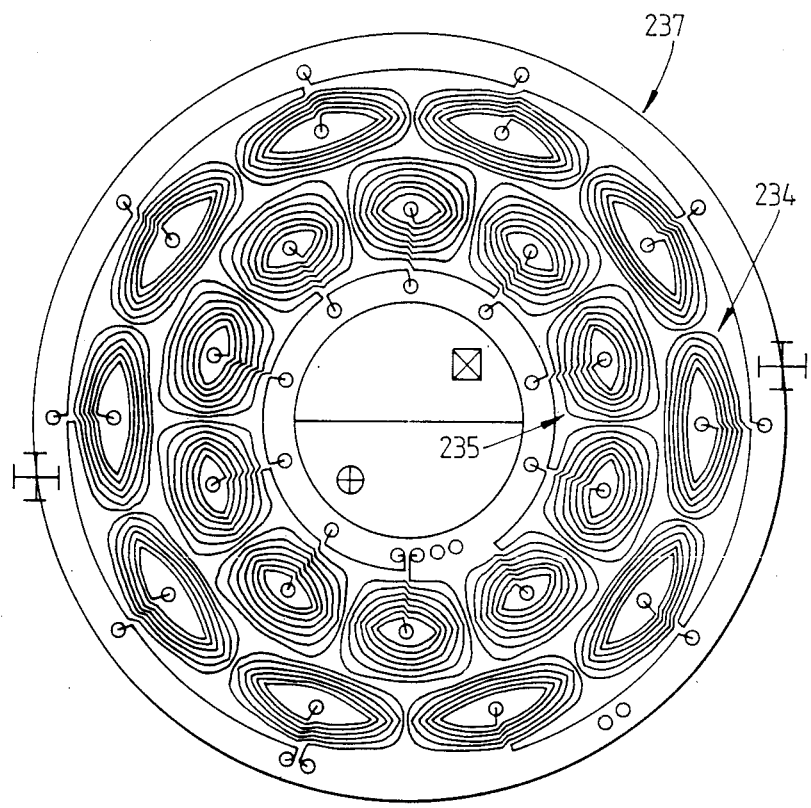
FIG. 30 shows one side of a printed circuit board similar to that of FIG. 29 but in this instance adapted for a multi-pole transducer, again in accordance with the principles of the invention.

For multi-turn coils laid out at a spacing around a sense winding for a planar rotary sensor, such as that depicted in subsequent FIG. 30, the basic linear pattern or layout is initially transformed to polar coordinates, and the complete multi-turn coil pattern as thus transformed is then laid out at a plurality of rotationally displaced locations by further rotational displacement or transformation of the basic pattern to each successive such location. Each location corresponds to a specified predetermined angle of further rotation of the basic layout in toto.

All the calculations described in the previous section are performed by the computer program. The program not only plots the final artwork, but allows the user to examine the winding in detail and make changes, if required, before the final plotting.

Figure 23:
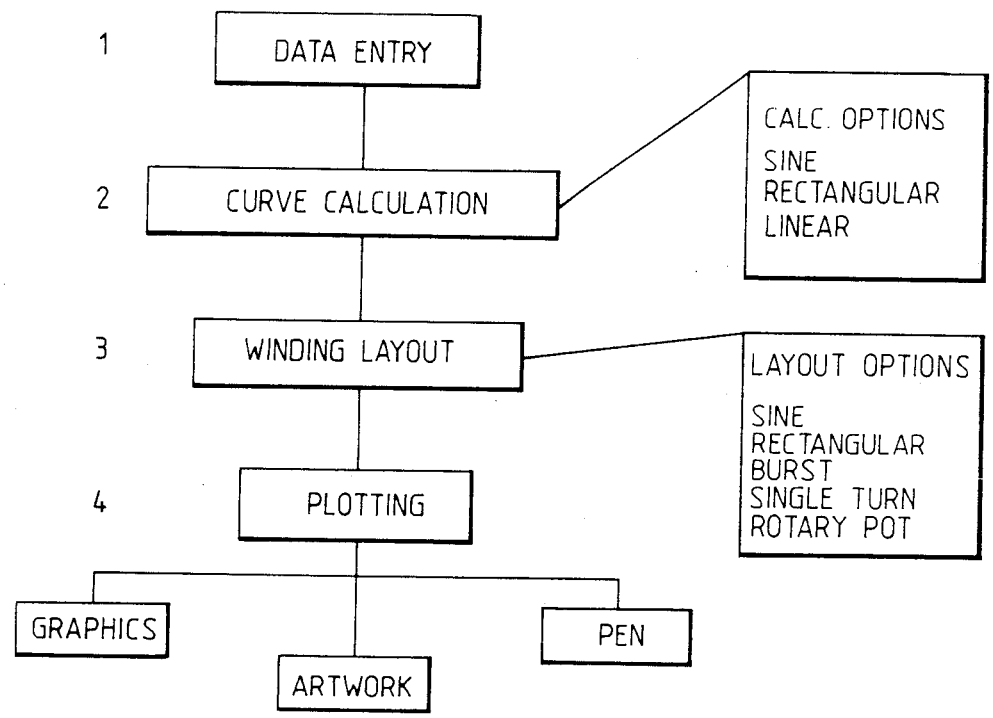
FIG. 23 is a block diagram of a computer program for calculating coil shapes for multiturn windings in accordance with the invention.

A block diagram of the program is shown in FIG. 23. The program is made up of a number of modules, various combinations of which are used depending on the desired winding type. The first stage, Data Entry, is universal for all windings and is used to edit winding and circuit board dimensions. A typical menu for this stage is shown in FIG. 24. To change any set of parameters, the appropriate line number is typed in and followed by new parameters.

In the second stage, the basic winding shape for two pole planar linear geometry is calculated. A number of options are available depending on the modulation type. For the foregoing example, linear modulation would be chosen. However, it is possible to obtain any form of modulation by defining the appropriate function for w'(x). For example, some of the boards of a device in accordance with the invention may have a sinusoidal modulation function to make the device suitable for use with resolver to digital converters, in which case the choice of function for w'(x) is Sin $\theta$. If linearization of the measurement system transfer function is required, the choice for w'(x) is then Arc Cos ($\theta$).

In the third stage, the Layout Stage, the winding shape is transformed to, for example, radial co-ordinates. At this stage, the winding crossovers and interconnecting tracks and pads are defined. Again, a number of options are available depending on modulation type and interconnection strategy.

At the final stage, the Plotting Stage, there are three possible output formats: Graphics Screen, a Pen Plot, or a Photoplot file. The output format is selected by the user while the running program, the graphics screen, is used to examine the artwork in detail, and the photoplot file is used to produce final circuit board artworks. A menu for the Graphics output or plotting menu is shown in FIG. 25. In Graphics plotting, there is a zoom facility to examine any part of the winding in detail. Also the distance, in mm, between any two points on the screen can be displayed by means of a further facility, to check pad and track clearances before final artwork plotting. Following this stage, it may be found necessary to modify one or more of the basic parameters. e.g. number of tracks or turns, coil spacing etc.

A plotting menu facilitates viewing the full PCB artwork or just some parts of it, such as the interconnection tracks or the pads for the plated through holes. At the Photoplotting stage, the final artwork scale, and track and pad sizes are defined by the user; the program then produces an output file of movement or plotting commands for a Photoplotter.

A particular advantage of this program is the speed with which new windings can be developed. It is possible to introduce correction factors into the calculation stage to account for any experimentally-measured transducer non-linearities. Thus windings giving very accurate outputs can be developed in just a few design iterations, with an empirical correction factor being applied to the function defining w'(x), derived, for example, from construction and testing of one or more prototype windings. Finally, it is possible to implement almost any transfer function to account for measurement system non-linearities and thus simplify the overall system.

The screen and sense winding Printed Circuit Board are, in effect, the heart of the transducer. Their design is the primary determining factor for the accuracy of the output modulation envelope. The advantages of working with printed circuit techniques are striking:

(1) excellent repeatability of pattern.
(2) great design flexibility and low tooling charges for new designs, and
(3) low piece cost.

The advantages apply to the manufacture of both windings and screens, since the latter are most economically manufactured by chemical machining. The computer based system for the electro-magnetic design of the transducers enables the required winding/screen patterns to be generated, and after checking on a penplot and graphics screen, the numerical output to be sent directly to a photoplotter, where the manufacturing artworks are generated. The principal inputs to the design program are:

(a) an expression for the desired modulation envelope (e.g. Sin $\theta$),
(b) an optional and arbitrary correction factor,
(c) outline winding dimensions,
(d) the number of concentric turns per coil,
(e) track size and spacing,
(f) details of output connections, and
(g) an indication of the internal sub-routines appropriate for generation of the desired winding type.

Given the expression for the modulation envelope, the software will calculate the correct winding pattern.

The calculations are simplified where the leading edges of the screen are radial. Calculations of unscreened area which assume perfectly even field distribution and 100% effectiveness of screens will not in practice yield the exact modulation envelope desired. However, the errors introduced are usually no more than a few percent, and the inclusion of an experimentally measured, position related, correction factor, which takes care of all errors, will normally allow sufficient accuracy to be achieved in a single iteration.

The accuracy specification for transducers according to the invention may be defined in terms of arc minutes maximum error. This is quite comparable with what is typically achieved from frameless resolvers of the same size. What is quite remarkable is that an accuracy of typically 1 part in 3000 can be achieved from such a simple device.

In general, devices in accordance with the invention may be designed to avoid the need for tight tolerances in mounting dimensions. This may be combined with a simple frameless mounting method and short axial length to greatly facilitate their incorporation within equipment. The ability to use injection moulded plastic parts throughout greatly facilitates low cost volume manufacture. The repeatability of the printed circuit windings and injection moulded parts opens the possibility of totally automated manufacture. The ease with which design equations can be translated from a computer keyboard into hardware makes the system of the invention truly of its time.

A further refinement enables crowding of the turns to be avoided, especially at the coil ends. In the arrangement of FIG. 21, the spacing "s" between turns is constant, this resulting in potentially excessively close coming together of turns at the ends of the winding. By increasing "s" with "x" i.e. altering the turn spacing for the outer coils, in the initial linear planar pattern or layout phase of the artwork design, better spacing of the turns is secured in the finished configuration. The polar transformation depicted in FIG. 22 incorporated such variable track and break point spacing at the linear planar stage, resulting in the significantly enhanced or increased turn spacing or more spread out configuration evident in the finally transformed pattern of this Figure.

Figure 28:
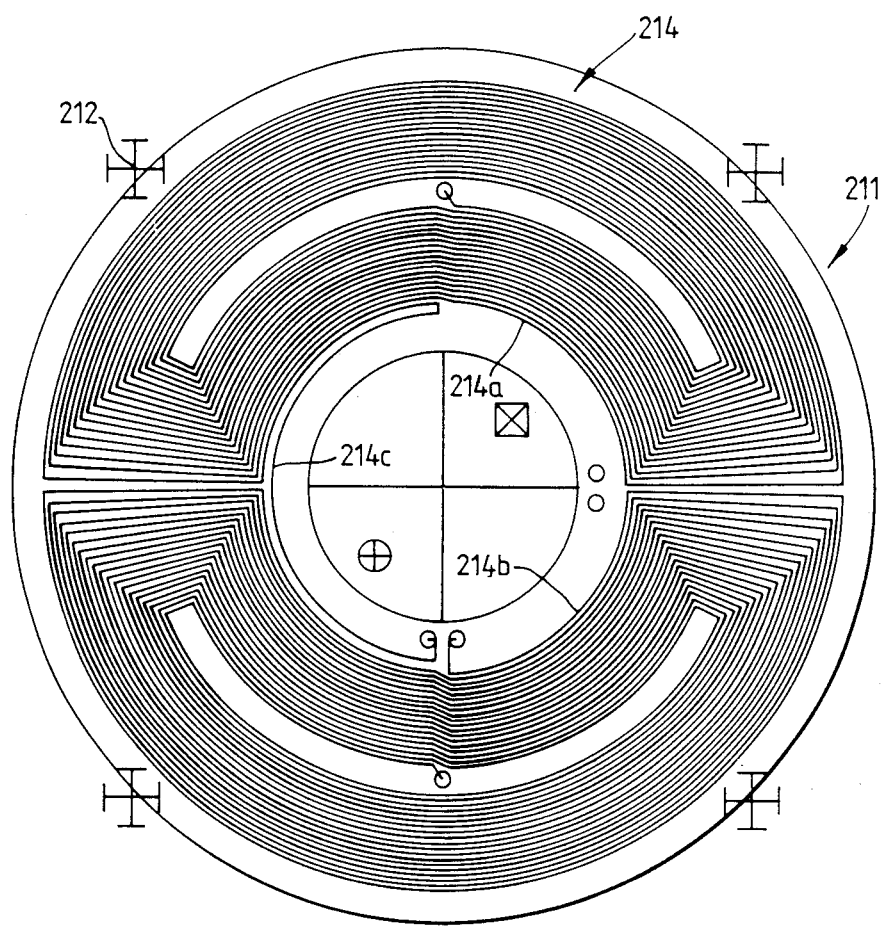
FIG. 28 shows one side of a printed circuit board prepared by the method of the invention to give piecewise linear modulation.

FIG. 26 shows one side of a typical double-sided printed circuit board 191 produced by the process described herein, together with an associated screen 199. The board and screen of FIG. 26 are designed for elongated working stroke output. FIG. 27 shows one side of a similar board 201 and screen 209 pair for sinusoidal output. FIG. 28 shows one side of a board 211 which gives piecewise linear modulation. The track spacing between the coils is selected in each case to be the minimum possible consistent with ease of PCB manufacture. In each of these Figures, a useful practical technique for ensuring correct registration of the printed circuit board within a transducer is also shown. Also, each board of these and subsequent Figures is provided with complementary printed circuit windings on each side of the board so that the effects of crossovers are cancelled out, as previously described.

In general, it is important for correct operation of a transducer that the copper track of the printed circuit board should have its central axis coincident with the centre axis of the transducer as a whole. One alignment procedure is to locate the board by engagement of its outer diameter within a mating annular spigot in the transducer. However, the manufacturing processes for printed circuit boards do not necessarily lend themselves to the maintenance of tight tolerances between track pattern and the outer dimensions of the board. Close tolerances may however more readily maintained between a track pattern and holes drilled in the board. The finished printed circuit boards may then be precisely located within the transducers by pins engaging in and passing through these drilled holes.

These aligning holes may be either full holes, or they may be half holes generally aligned with an outer diameter of a circular printed board. Such half holes may be initially drilled as full holes, and the surplus peripheral region of the board subsequently cut away. By use of this technique, the transducer may be designed so that the outer periphery or diameter of the printed circuit board is clear of any contact with any other element of the transducer unit, other than at the alignment holes and their mating pins, which provide location of the board.

FIG. 26 shows a circular printed circuit board 191, having half circular alignment holes 192 at opposite ends of a diameter of the board. In units where it is required to locate two printed circuit boards in electrical quadrature with respect to one another, such as in arrangements where sinusoidal modulation is required, the holes may be drilled for alignment with pins located on a 45° axis, so that the inversion of one printed circuit board relative to the other will achieve correct relative alignment of the boards for electrical quadrature.

FIG. 27 shows an arrangement of this kind, in which board 201 has full holes 202 located on one diameter and half holes 203 located on a second diameter, displaced by 45° from the first diameter, on which holes 202 are located.

In FIG. 28, printed circuit board 211 has peripheral half-hole centres identified by references 212 and carries a sensor winding 214 shaped to give piecewise linear modulation. The sense winding coils 214a and 214b are equivalent in rotary planar terms to the rectangular coils of the simplified planar representation of FIG. 3. The double-sided board with two PCWs in back-to-back disposition ensures cancellation of any cross-over type effects, and this balance also extends to the innermost reverse link 214c of FIG. 28.

Figure 29:
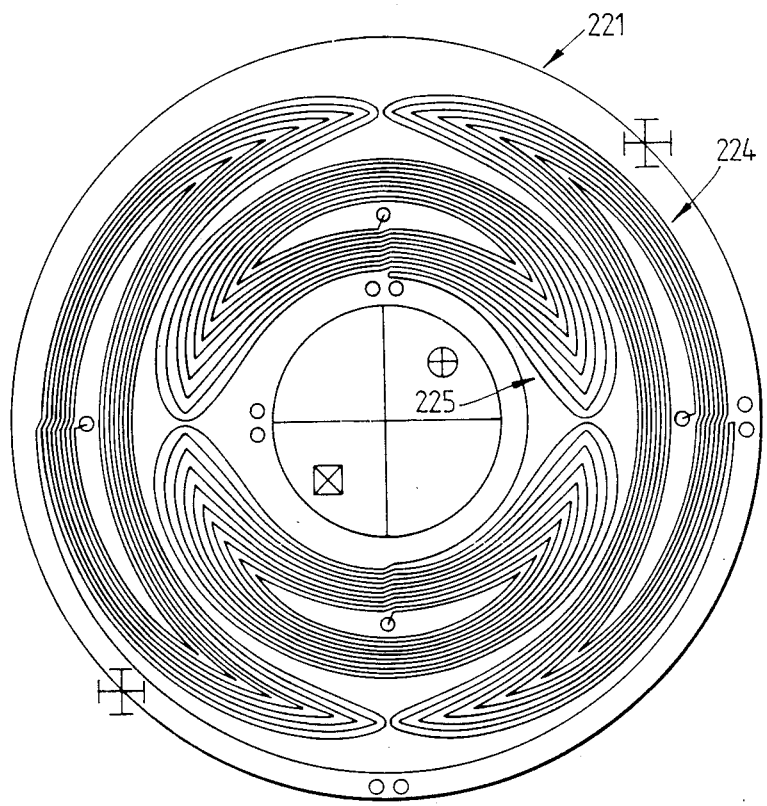
FIG. 29 shows one side of an alternative printed circuit board arrangement for a screened inductance sensor, in which two quadrature windings are laid on a single board at different mean diameters using the method of the invention.

Two circuit boards of the kind shown in, for example, FIG. 27, may be used to give outputs in phase quadrature. In such an arrangement, the two printed circuit boards are mounted in quadrature. Alternatively, two quadrature phases can be laid on one PCB, such as is illustrated in FIG. 29, and each phase winding is formed by series combination of one winding from each of the two boards. The advantage is substantial reduction in quadrature error due to quadrature misalignment of boards. There is also immunity to magnitude mismatch because of the averaging effect over the two boards. FIG. 29 shows a single-board arrangement with two quadrature windings 224, 225 laid on a single PCB 221 at different mean diameters.

FIG. 30 shows a similar arrangement for a multipole transducer in which board 231 has a multiplicity of windings 234, 235, an outer series of coils 234 being on a first mean diameter and a second or inner series of coils 235 being laid out along a path of a second mean diameter less than that of the circumferential locus on which coils 234 are disposed. The advantages of this single-board arrangement became more significant at the higher number of poles, because any mechanical quadrature misalignment between phases results in an electrical misalignment multiplied by half the number of poles.

Figure 31:
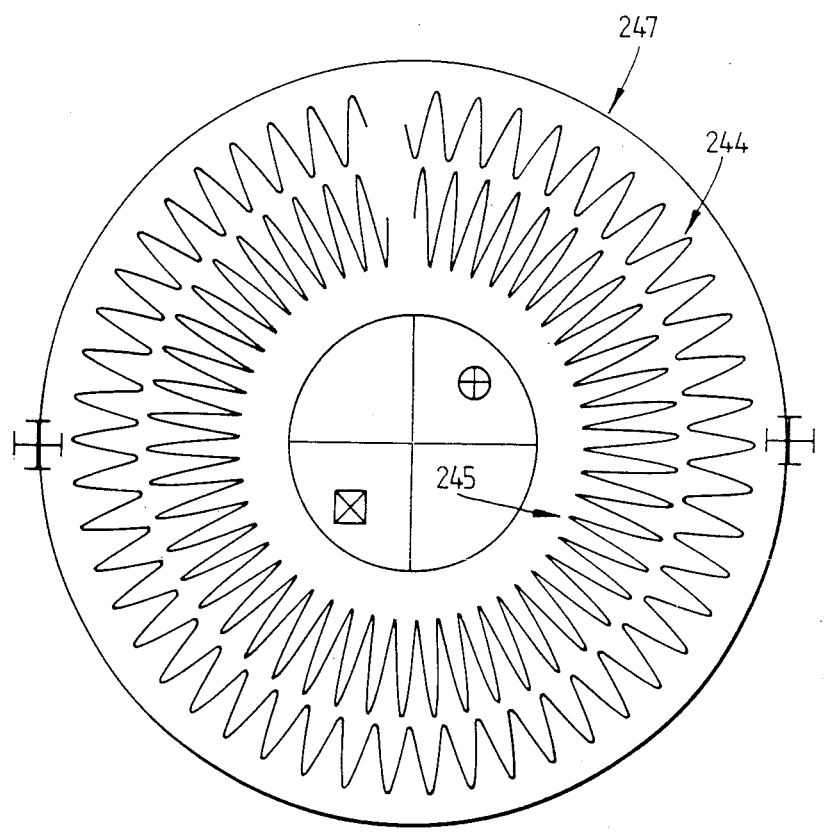
FIG. 31 is a representation of one side of a printed circuit winding prepared in accordance with the invention for a one hundred pole transducer.

FIG. 31 shows one side of a winding configuration for a double-sided PCB for a 100 pole transducer board 241 carrying outer 244 and inner 245 sense windings. In this arrangement, single turn sinusoidally shaped windings are used in each case, because of space limitations on the board.

Figure 32:
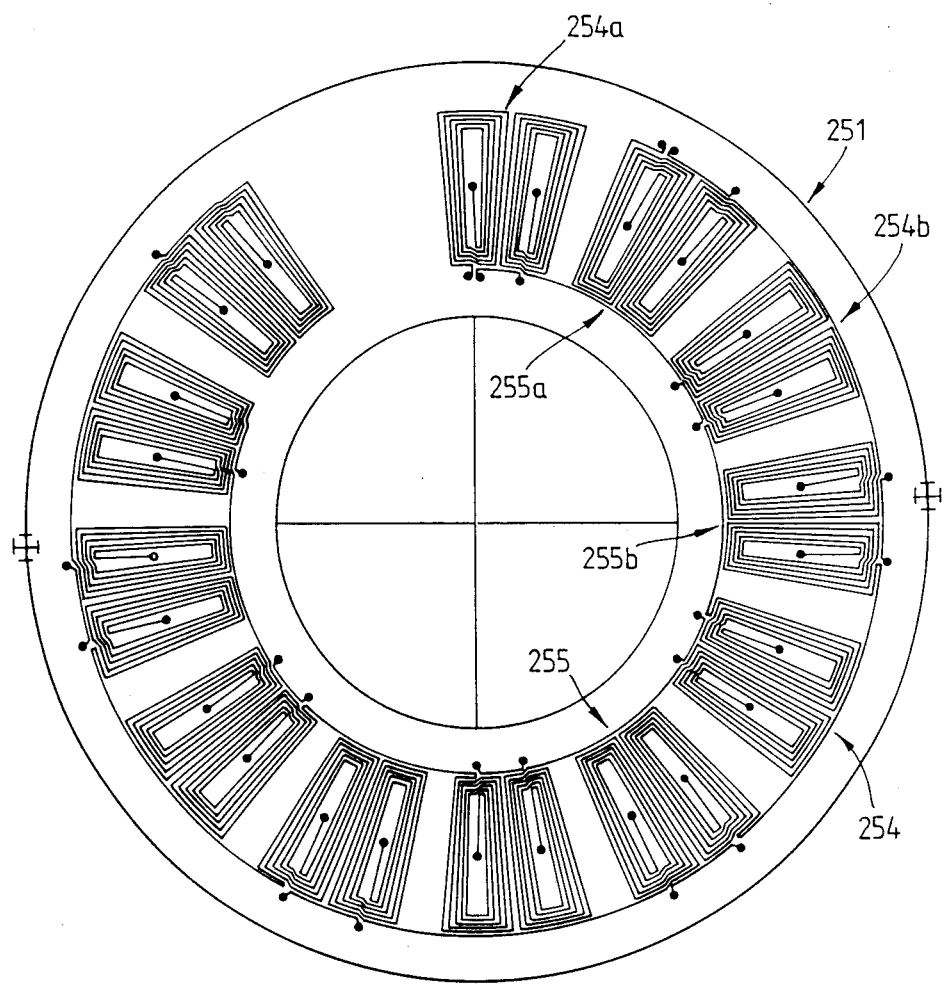
FIG. 32 shows one side of a printed circuit board provided in accordance with the invention with two quadrature windings, each having the same mean diameter.

The winding shown in FIG. 32 has two quadrature windings 254, 255 on a single PCB. each winding 254 and 255 having the same mean diameter. Alternate sets of coil pairs are connected in series to form the two phase windings. Thus, for example, coil pairs 254a and 254b define a portion of a first phase winding, while coil pairs 255a and 255b define a portion of a second phase winding. This winding is most useful for large diameter multicycle transducers. It has the advantages of having perfect quadrature and magnitude matching between phases.

All of the PCB and winding configurations shown in FIGS. 26 to 32 are suitable for preparation by the computer technique previously described in regard to FIGS. 20 to 25. The "concentric" distributed winding arrrangements shown in certain of these Figures are of the general kind already described in regard to FIG. 6.

The further arrangements shown in FIGS. 33 to 39 relate to winding configurations which permit displaced-turn multi-turn distributed windings of the kind described in regard to FIG. 7 to be realized by similar economical printed-circuit (P.C.) techniques likewise adapted to computer design and artwork layout. They are described in the context of "Resolver Lookalikes" having sine and cosine target waveforms. These winding arrangements are described in regard to rotary planar configurations of sense winding.

The advantages of displaced-turn multi-turn distributed windings lie in higher output voltage from a given device size, and higher precision of the output waveform. The latter is achieved because of the averaging effect over a number of turns. Minor deviations in a particular turn are lessened in relative importance, and, by a well-known property of distributed windings, the fundamental and attenuating harmonics are reinforced, with complete rejection of particular harmonics.

The basic winding element of a screened inductive position or speed sensor in many configurations is a "figure-of-eight" shaped coil. Distributing a number of coils of this shape by coil displacement rather than by a "concentric" layout results in a large number of crossovers, creating difficulties for printed-circuit realization. Displaced-turn distributed windings may, of course, be provided by various "labour-intensive" techniques, e.g., by forming grooves into which the winding wire is pressed. It may however be difficult to assure consistent results at low cost by such a method.

It is a purpose of the present variant of the invention to form windings equivalent to displaced-turn distributed windings, having the same flux-linkage properties as straightforward displaced-turn distributed windings, but requiring no crossovers. These "equivalent distributed windings" are appropriate for forming by printing, and show the same low error and harmonic rejection properties as straightforward displaced-turn distributed windings.

Figure 33:
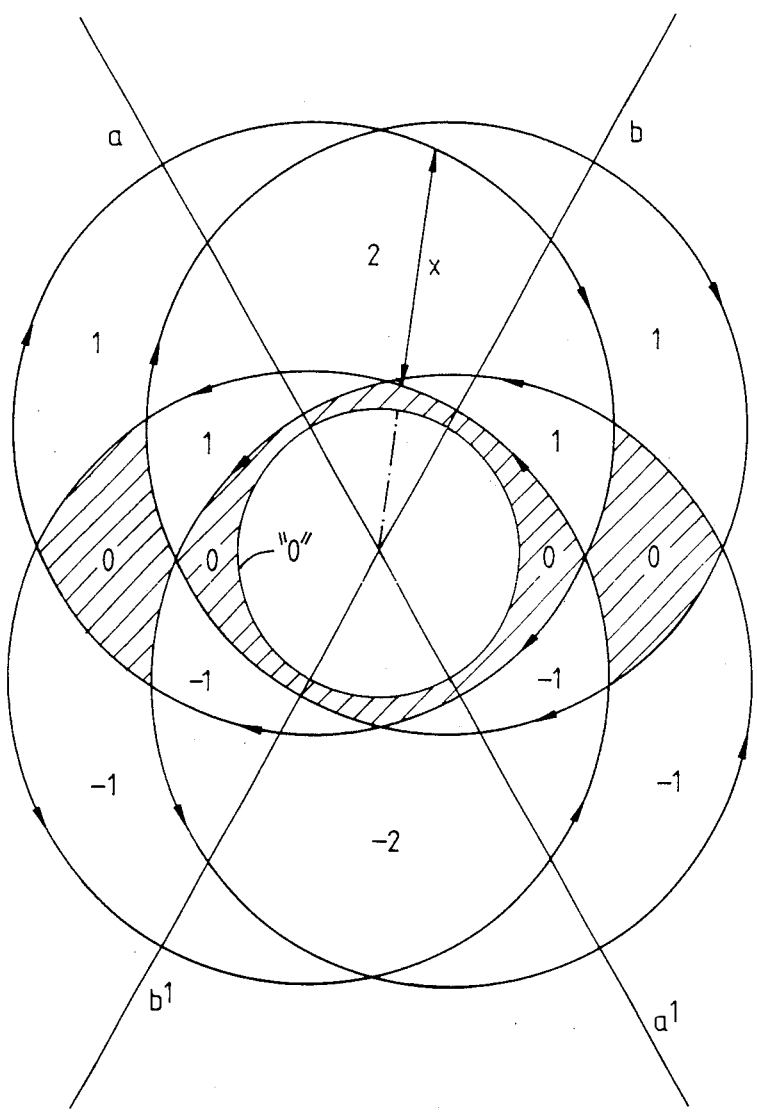
FIG. 33 is an idealized schematic representation of a pair of sense coils for a planar rotor geometry, which are circumferentially displaced relative to one another.

In the idealized schematically represented distributed winding of FIG. 33, four circular (or near-circular) coils a, a', and b, b', are provided, for a planar rotary device printed circuit board having a central aperture denoted by "0". Coils a, a' constitute a basic "figure of eight" contra-connected pair designed to exhibit an approximately sinusoidal flux-linkage variation with angle. Coils b, b' constitute an identical pair displaced clockwise by 60 degrees. In this elementary displaced-turn distributed winding, the turns are connected in series in a threading sense shown by the arrows. If flux is regarded as acting in a direction substantially perpendicular to the plane of the drawing, the number of linkages with each mesh region defined by the intersections of the windings can be seen by inspection and is denoted by the numbers 2, 1, 0, −1, −2. In visualizing this, it is helpful to imagine the coils to carry currents as shown by the arrows, and to count the number of times the current links each mesh region, i.e. to count the number of conductors located outward in the radial sense of any particular observer location or mesh region. It will be appreciated that in general the currents flowing in the sense windings are very small and are not normally of significance, but the identification by direction of notional current flows in the sense winding assists in visualizing how a winding equivalent to a displaced-turn distributed winding may be provided.

Figure 34:
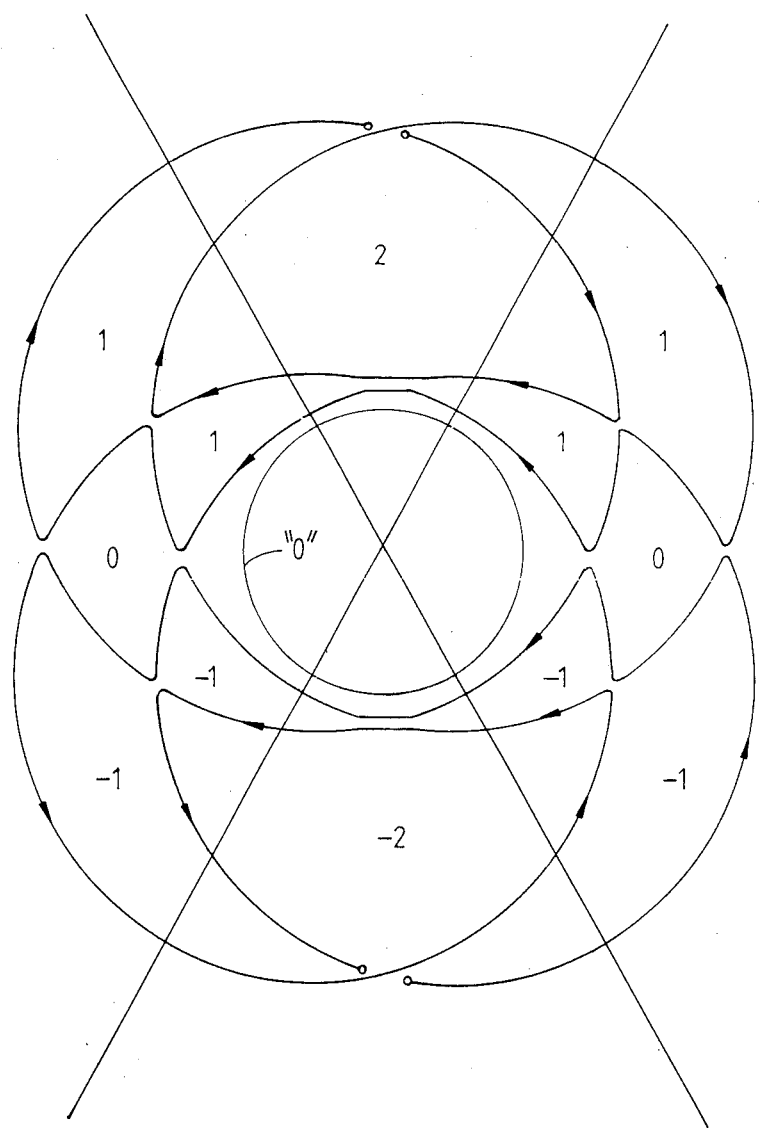
FIG. 34 shows a winding scheme equivalent to that of FIG. 33 but having only two crossovers, and suitable therefore for printed circuit realization in accordance with the invention.

According to the invention, any conductor trajectory which links the meshes with the same number of turns is equivalent. FIG. 34 shows such an equivalent winding scheme which has only two crossovers, and these are confined to the exiting leads, as compared with the twelve crossovers of FIG. 33. Thus, the winding of FIG. 34 provides a winding akin to the "concentric" type winding of FIG. 6 and others of the Figures, but is equivalent to the displaced-turn distributed winding of FIG. 33. As in the case of FIG. 33, the direction of notional current flow in the various segments of this equivalent winding is indicated in FIG. 34, and it will be seen that the notional current patterns of FIGS. 33 and 34 are identical. Thus the two windings are equivalent in electromagnetic terms.

It may also be noted that for sinusoidal modulation, the intercept "x" along a radius extending from the centre of the disc on which the winding is laid, which coincides with the axis of rotation of the sensor, should vary in sinusoidal manner with circumferential displacement, i.e. movement in the direction of the screen/winding displacement. In the idealized configuration of FIG. 33, with circular windings, this desired sinusoidal modulation may be approximate, and in a practical arrangement, a more precise coil shaping may be appropriate.

Figure 35:
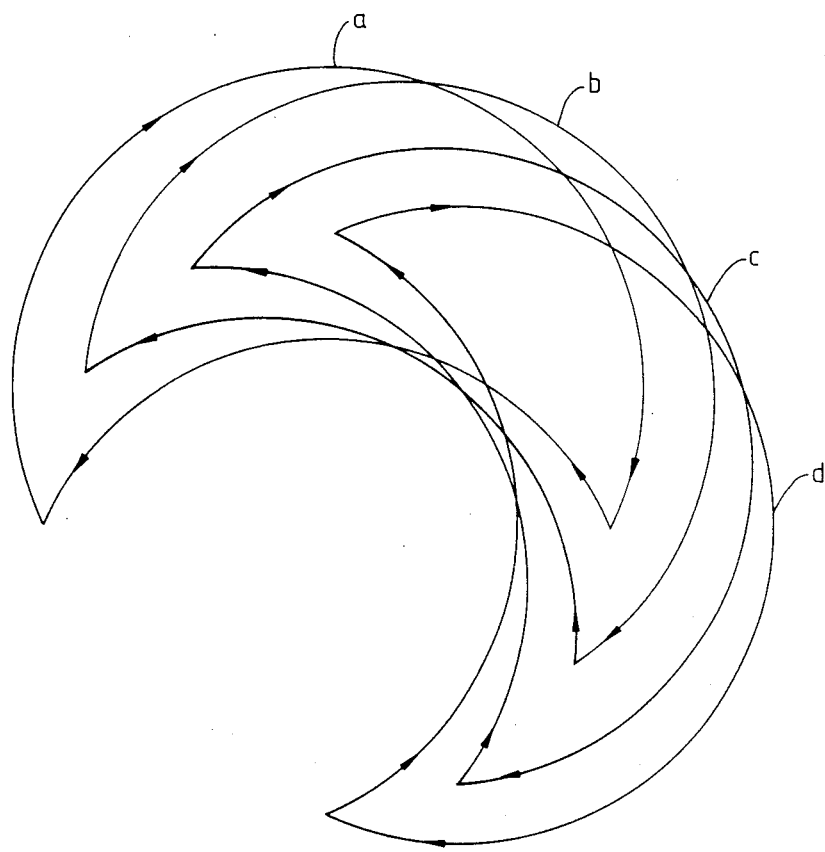

FIG. 35 shows four crescent-moon shaped coils a, b, c, d, for a rotary planar screened inductance sensor circumferentially displaced in steps of 30°. The third harmonic is eliminated here, its phase shift between coils being 3×30° or 90°, so that its four phasors lie along the sides of a square. By very minor re-routing, four "concentric" coils a', b', c', d', of different pitches, can be formed in series, resulting in the configuration shown in FIG. 36, in which the crossovers of FIG. 35 are eliminated, for a printed circuit board with central aperture "0".

Figure 36:
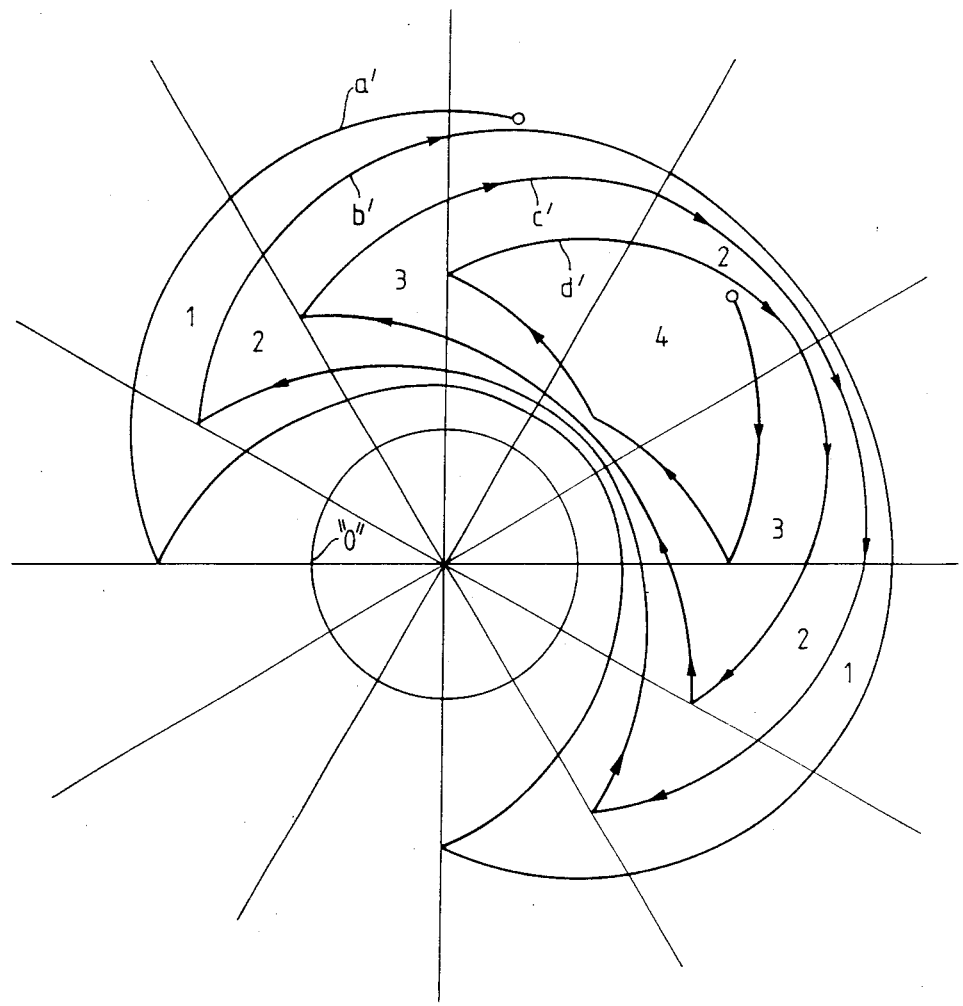
FIG. 36 shows a re-routed equivalent winding arrangement resulting in four concentric coils of different pitches.
Figure 37:
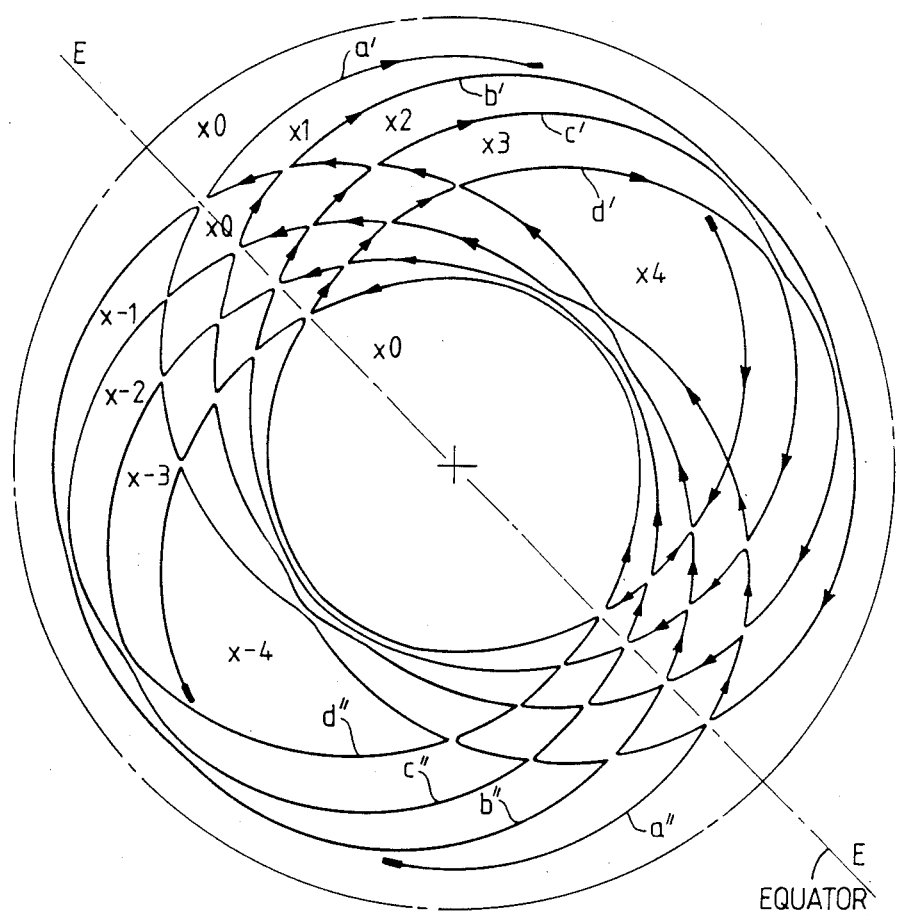
FIG. 37 shows an equivalent winding arrangement to those of FIGS. 35 and 36 facilitating association with a corresponding group of crescent coils placed in an opposed disposition on one side of a double sided PCB.

FIG. 37 shows how interpenetration of coils a', b', c', d' of FIG. 36 with four complementary counter-clockwise crescents a", b", c", and d" can be accomodated by further reshaping in the region of the "horns" of the crescent, where, in the configuration of FIG. 37, the coil extremities extend across the diameter delimiting one boundary of the generally semi-circular region within which the crescent coils are located. The numbers in the meshes denote the appropriate nett linkage, and these are effected using "concentric" coils. The coils have a peculiar toothed appearance, but no coils project across the axis of symmetry EE dividing the clockwise coils from the anti-clockwise coils. Comparison of the notional current directions indicated for each winding in FIGS. 35, 36, and 37 shows that on the equivalent winding of FIG. 37, the notional current pattern is identical with that of FIG. 36, so that the broadly "concentric" distributed winding of FIG. 37 is again equivalent to the "displaced-turn" distributing windings of FIGS. 35 and 36.

Figure 38:
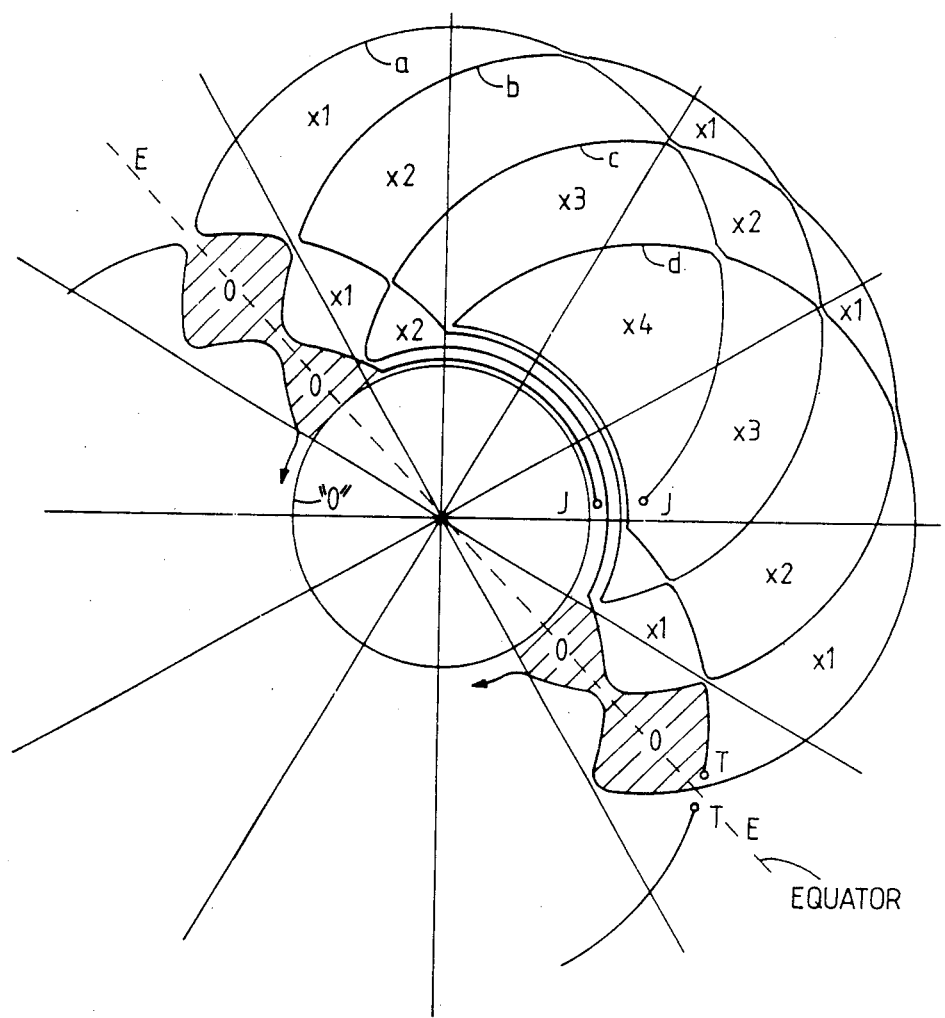
FIG. 38 shows an alternative arrangement to that of FIG. 37, but also equivalent to the winding layout of FIGS. 35 and 36.

FIG. 38 shows an alternative arrangement in which the crescent inner profiles are concentric with the machine axis. A short jumper connection at JJ places the coils a and d in series. Preferably, the rotating flux screen should extend radially to cover this jumper connection. Below the "Equator" or axis of symmetry EE, the corresponding portions of an entirely symmetric set of coils may be similarly placed in series by a corresponding jumper. The terminals TT serve the entire winding on the PCB, central aperture "0" being also indicated. More highly distributed windings than those shown in the present drawings may also be used.

Figure 39:
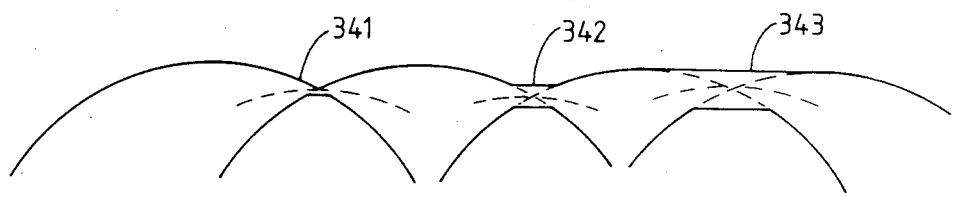
FIG. 39 is a representation of permissible shape deviations in the equivalent winding layouts of FIGS. 34, 37 and 38 in the region of the notional "crossover" points.

There may be advantages in departing from the coil shapes "inherited" in the derivation of the "concentric" equivalent windings from the displaced-turn distributed starting windings. It is not required that individual coil voltages vary sinusoidally: "give and take" is allowed. Thus, the "equivalent" outer coil profile may be allowed to deviate from the shape of the envelope of two "source" overlapping coils, provided the "equivalent" inner coil deviates equally in a compensating sense. FIG. 39 illustrates a variety of permissible shape deviations near the original "crossover" points of the basic displaced-turn windings from which the non-crossing-over equivalent concentric concentric windings are derived. Successively increasing track spacings or separations are indicated in solid lines by successive references 341, 342, 343, together with, as dotted lines, the original crossing—over paths of the basic displaced-turn distributed winding from which the "concentric" PCB-adapted equivalents are derived. Such minor re-profiling serves to increase track clearance without adversely affecting accuracy. Applying this concept to FIG. 37, some of the equivalent coil profiles shown could be smoothed into near circular arcs with advantage. Coil shapes are of course also "fine-tuned" into precision, using harmonic analysis of waveforms obtained with experimental prototypes.

We claim:

1. A sensor comprising a drive or exciting winding for establishing a forward or drive field, at least one secondary or sense winding in which a voltage may be induced in the presence of said forward or drive field, and at least one conductive screen within which eddy currents are generated in the presence of said forward or drive field to establish a counter-field opposing said forward or drive field, said at least one conductive screen and said at least one secondary or sense winding being displaceable relative to one another within said forward or drive field so that said at least one secondary or sense winding may be shaded by said at least one conductive screen to a varying extent to thereby vary the voltage induced in said at least one secondary or sense winding, and barrier means being interposed between the windings of the sensor and said at least one conductive screen so that said at least one conductive screen may be disposed within a region environmentally isolatable from the region in which said drive or exciting winding and said at least one secondary or sense winding are located, wherein said barrier means comprises a stator portion on which said drive or exciting winding and said at least one secondary or sense winding are disposed, said stator portion has means for guiding displacement of said at least one conductive screen for said shading of said at least one secondary or sense winding, and said means for guiding displacement of said at least one conductive screen is an axle or pin, and the sensor includes a screen assembly rotatingly mounted on said axle or pin.

* * * * *